(12) United States Patent
Morton

(10) Patent No.: US 11,899,739 B2
(45) Date of Patent: *Feb. 13, 2024

(54) VERIFYING THE DESIGN OF AN ARTICLE OF MANUFACTURE CONTAINING THE ARRANGEMENT OF SHAPES SUBJECT TO BOUNDARY DISTANCE CONSTRAINTS AMONG THOSE SHAPES

(71) Applicant: Monarch Intellectual Property LLC, Austin, TX (US)

(72) Inventor: Paul B. Morton, Austin, TX (US)

(73) Assignee: Monarch Intellectual Property LLC, Austin, TX (US)

( * ) Notice: Subject to any disclaimer, the term of this patent is extended or adjusted under 35 U.S.C. 154(b) by 1039 days.

This patent is subject to a terminal disclaimer.

(21) Appl. No.: 16/405,488

(22) Filed: May 7, 2019

(65) Prior Publication Data

US 2019/0303510 A1    Oct. 3, 2019

Related U.S. Application Data

(63) Continuation of application No. 14/969,968, filed on Dec. 15, 2015, now Pat. No. 10,346,555, which is a
(Continued)

(51) Int. Cl.
*G06F 17/11* (2006.01)
*G06F 30/00* (2020.01)
(Continued)

(52) U.S. Cl.
CPC .............. *G06F 17/11* (2013.01); *G06F 17/00* (2013.01); *G06F 30/00* (2020.01); *G06F 30/20* (2020.01)

(58) Field of Classification Search
None
See application file for complete search history.

(56) References Cited

U.S. PATENT DOCUMENTS

| 6,671,867 B2 | 12/2003 | Alpert et al. |
| 8,498,843 B2 | 7/2013 | Morton |

(Continued)

OTHER PUBLICATIONS

Bennell, J., Guntram Scheithauer, Yurij Stoyan, and Tatiana Romanova. "Tools of mathematical modeling of arbitrary object packing problems." Annals of Operations Research 179, No. 1 (2010, online: 2008): 343-368 (Year: 2008).*

(Continued)

*Primary Examiner* — Steven W Crabb
(74) *Attorney, Agent, or Firm* — Matthew J. Booth PC; Matthew J. Booth

(57) ABSTRACT

This disclosure describes a method to verify the design of an article of manufacture that includes a software program executing on a workstation that executes the following steps: providing the shape of a first component and providing the shape of a second component; providing a boundary distance constraint; constructing a shape spectrum of the exterior boundary surface of closest approach associated with the shape of the first component, the shape of the second component, and the boundary distance constraint; verifying that the arrangement of the shape of the first component and the shape of the second component satisfy the boundary distance constraint; evaluating a subderivative of the shape spectrum of the exterior boundary surface of closest approach associated with the shape of the first component, the shape of the second component; where verifying that the boundary distance constraint is satisfied between the shape of the first component and the shape of the second component and when satisfied, the design of the article of manufacture can be verified.

10 Claims, 13 Drawing Sheets

Related U.S. Application Data continuation of application No. 13/908,586, filed on Jun. 3, 2013, now abandoned, and a continuation of application No. 13/866,677, filed on Apr. 19, 2013, now abandoned, said application No. 13/908,586 is a continuation of application No. 12/870,692, filed on Aug. 27, 2010, now Pat. No. 8,498,843, said application No. 13/866,677 is a continuation of application No. 12/844,585, filed on Jul. 27, 2010, now Pat. No. 8,521,486.

(60) Provisional application No. 61/248,234, filed on Oct. 2, 2009, provisional application No. 61/246,648, filed on Sep. 29, 2009, provisional application No. 61/231,825, filed on Aug. 6, 2009.

(51) Int. Cl.
  *G06F 17/00* (2019.01)
  *G06F 30/20* (2020.01)

(56) References Cited

U.S. PATENT DOCUMENTS

| | | |
|---|---|---|
| 8,521,486 B2 | 8/2013 | Morton |
| 10,346,555 B2 | 7/2019 | Morton |
| 2003/0196183 A1 | 10/2003 | Alpert et al. |
| 2007/0208996 A1* | 9/2007 | Berkner ............... G06F 40/106 706/19 |
| 2011/0035194 A1 | 2/2011 | Morton |
| 2011/0035196 A1 | 2/2011 | Morton |
| 2014/0107988 A1 | 4/2014 | Morton |
| 2014/0107989 A1 | 4/2014 | Morton |
| 2016/0162605 A1 | 6/2016 | Morton |
| 2019/0303510 A1 | 10/2019 | Morton |

OTHER PUBLICATIONS

Li, Zhenyu, and Victor Milenkovic. "Compaction and separation algorithms for non-convex polygons and their applications." European Journal of Operational Research 84, No. 3 (1995): 539-561 (Year: 1995).*

Morton, Paul B. "Using an Analytical Computational-Geometry Library to Model Nonoverlap and Boundary-Distance Constraints and their Application to Packing Poly-Bezier Shapes." (2021), obtained from http://www.optimization-online.org/DB_FILE/2021/12/8747.pdf on Mar. 29, 2022 (Year: 2021).*

Stoyan, Yu, M. Gil, T. Romanova, J. Ternoy, and G. Scheithauer. "Construction of a-function for two convex polytopes." 22 pages (2000), obtained from http://citeseerx.ist.psu.edu/viewdoc/download?doi=10.1.1.28.9100&rep=rep1&type=pdf on Mar. 30, 2022 (Year: 2000).*

Stoyan, Yurij, Guntram Scheithauer, Nikolay Gil, and Tatiana Romanova. "ϕ-functions for complex 2D-objects." Quarterly Journal of the Belgian, French and Italian Operations Research Societies 2, No. 1 (2004): 69-84 (Year: 2004).*

Dorai, et al., "COSMOS—a representation scheme for 30 free-form objects", IEEE Transactions on Pattern Analysis & Machine Intelligence, vol. 19, No. 1 0,, 1997, 1115-1130.

Dorai, "Representation and recognition of 3d free-form objects", PhD thesis, Michigan State University, 1996, 226.

Herrigel, et al., "An Analytic Optimization Technique for Placement of Macro-Cells", 26th Conference on Design Automation, Jun. 25-29, 1989, 376-381.

Leung, "An Efficient Collision Detection Algorithm for Polytopes in Virtual Environment", M. Phil Thesis; The University of Hong Kong, Sep. 1996, 1-87.

Mir, "Analytical Technique for Macrocell Placement Optimization with Multiple Constraints", Proceedings of the 2003 10th IEEE International Conference on Circuits and Systems; vol. 2, Dec. 14-17, 2003, 503-506.

Moustakas, et al., "A Geometry Education Haptic VR Application Based on a New Virtual Hand Representation", IEEE Virtual Reality 2005, Mar. 12-16,, pp. 249-252.

* cited by examiner

VERIFYING THE DESIGN OF AN ARTICLE OF MANUFACTURE CONTAINING THE ARRANGEMENT OF SHAPES SUBJECT TO BOUNDARY DISTANCE CONSTRAINTS AMONG THOSE SHAPES

CROSS REFERENCE TO RELATED APPLICATIONS

This application incorporated by reference for all purposes into this specification U.S. Provisional Application Ser. No. 61/231,825, filed 6 Aug. 2009.

This application incorporates by reference for all purposes into this specification U.S. Provisional Application Serial No. 61/246,648, filed 29 Sep. 2009.

This application incorporates by reference for all purposes into this specification U.S. Provisional Application Serial No. 61/248,234, filed 2 Oct. 2009.

This application is a continuation of U.S. application Ser. No. 12/844,585, filed 27 Jul. 2010, now U.S. Pat. No. 8,521,486, issued on 27 Aug. 2013, which is incorporated by reference for all purposes into this specification.

Additionally, this application is a continuation of U.S. application Ser. No. 12/870,692, filed 27 Aug. 2010, now U.S. Pat. No. 8,498,843, issued on 30 Jul. 2013, which is incorporated by reference for all purposes into this specification.

Additionally, this application is a continuation of U.S. application Ser. No. 13/866,677, filed 19 Apr. 2013, which is incorporated by reference for all purposes into this specification.

Additionally, this application is a continuation of U.S. application Ser. No. 13/908,586, filed 3 Jun. 2013, which is incorporated by reference for all purposes into this specification.

Additionally, this application is a continuation of U.S. application Ser. No. 14/969,968, filed 15 Dec. 2015, which is incorporated by reference for all purposes into this specification.

TECHNICAL FIELD

This disclosure relates to determining if boundary distance constraints are satisfied. More specifically, this disclosure relates to determining if arrangements of shapes satisfy exact or approximate analytical function representations of boundary distance constraints among those shapes.

BACKGROUND ART

The process of checking an arrangement of shapes to determine if it satisfies one or more boundary distance (BD) constraints between those shapes has many valuable commercial applications. For brevity we will refer to this process as boundary distance constraint verification (BDCV). Applications of BDCV include, for example, their use in methods to search for arrangements of shapes that exactly or approximately satisfy one or more BD constraints and, their use in checking the results of methods that attempt to generate arrangements of shapes that exactly or approximately satisfy one or more BD constraints to verify that the BD constraints have been exactly or approximately satisfied.

Instances of the BDCV problem include, for example, verifying that two- or three-dimensional components on or in a manufactured product do not overlap and all components are contained within the product's boundaries. Examples include verifying the BD constraints between: the components inside the body of a car; the components inside the case of a printer; the rooms in a building; the components on a circuit board or; the components on VLSI chip. Other instances include verifying that an arrangement of one or more products or product components in or on a piece of material from which they are to be extracted have sufficient space between them to allow for the kerf of the cutting tool. Examples include verifying the BD constraints between the components of a pair of pants on a bolt of fabric or the components of a ship on a sheet of steel. Other instances in the area of packing and shipping include verifying that an arrangement of packages inside a shipping container satisfy the requirement that no packages occupy the same space and all packages fit inside the container. Some of these instances can further be extended into 4-dimensional problems where, for example, time constraints, or time dependent motion requirements are present.

SUMMARY OF INVENTION

This disclosure describes a method and product to verify the design of an article of manufacture that further comprises two or more components of the article and that uses a software program executing on a workstation that should satisfy the analytical representation of the boundary distance constraint between the shapes of two components during the verification of the design of the article of manufacture. This embodiment includes providing a software program executing on a workstation, the workstation includes a processor, memory, and storage, the software program executes the following steps: providing the shape of a first component and providing the shape of a second component; providing a boundary distance constraint, the boundary distance constraint specifies the desired geometric relationship to be verified between the shape of the first component and the shape of the second component; constructing a shape spectrum of the exterior boundary surface of closest approach associated with the shape of the first component, the shape of the second component, and the boundary distance constraint, where the shape spectrum is an analytical representation of the boundary surface of closest approach and forms the analytical foundation for verifying the boundary distance constraint; verifying that the arrangement of the shape of the first component and the shape of the second component satisfy the boundary distance constraint; evaluating a sub-derivative of the shape spectrum of the exterior boundary surface of closest approach associated with the shape of the first component, the shape of the second component, and the boundary distance constraint, where the subderivative is used in the evaluation of the boundary distance constraint and where the exterior boundary surface of closest approach is the shape that forms the geometric foundation for the step of evaluating the boundary distance constraint; where verifying that the boundary distance constraint is satisfied between the shape of the first component and the shape of the second component and when satisfied, the design of the article of manufacture can be verified.

The above embodiment of the invention may include one or more of these additional embodiments that may be combined in any and all combinations with the above embodiment. One embodiment of the invention describes where the boundary distance constraint is that the two components do not overlap. One embodiment of the invention describes where the boundary distance constraint is that the two components overlap by a fixed distance. One embodiment of the invention describes where the boundary distance constraint is that the two components abut. One embodiment of the invention describes where the boundary distance constraint is that the two components are no closer than a fixed distance.

BRIEF DESCRIPTION OF DRAWINGS

The drawings accompanying and forming part of this specification are included to depict certain aspects of the disclosure. A clearer impression of the disclosure, and of the components and operation of systems provided with the disclosure, will become more readily apparent by referring to the exemplary, and therefore non-limiting, embodiments illustrated in the drawings, where identical reference numerals designate the same components. Note that the features illustrated in the drawings are not necessarily drawn to scale. The following is a brief description of the accompanying drawings.

DISCLOSURE OF EMBODIMENTS

Figure 1A:
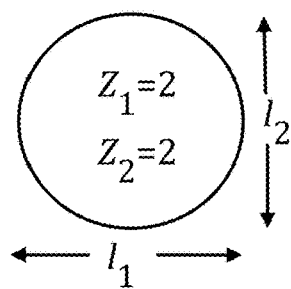
FIG. 1A-1H illustrate various two and three dimensional superellipsoids.
Figure 1E:
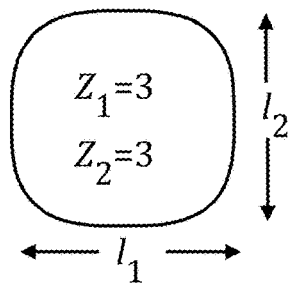
Figure 1B:
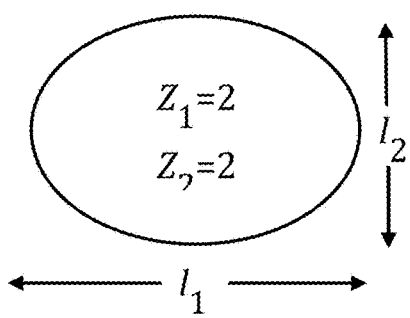
Figure 1F:
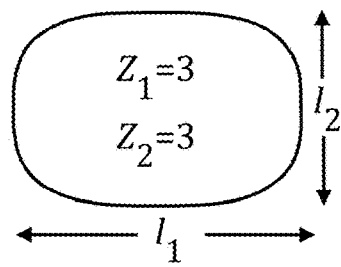
Figure 1C:
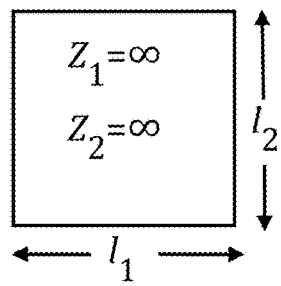
Figure 1G:
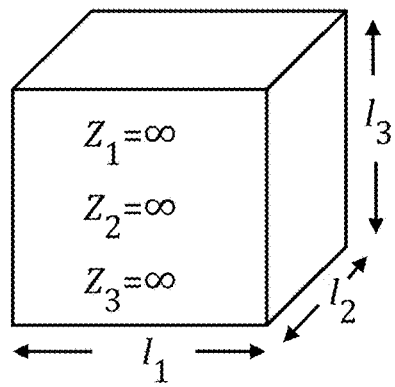
Figure 1D:
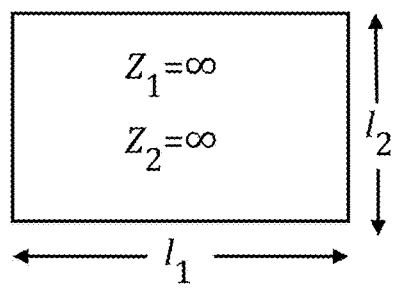
Figure 1H:
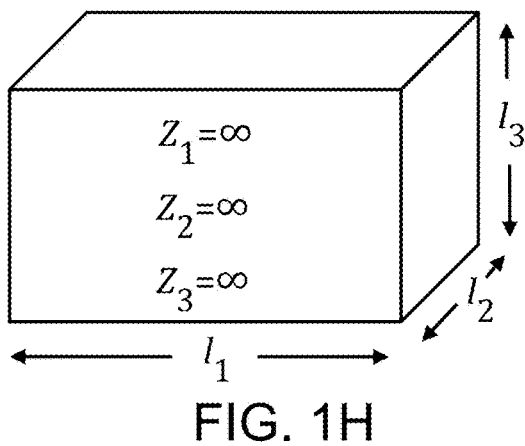

The disclosed embodiments should describe aspects of the disclosure in sufficient detail to enable a person of ordinary skill in the art to practice the invention. Other embodiments may be utilized, and changes may be made without departing from the disclosure. The following detailed description is not to be taken in a limiting sense, and the present invention is defined only by the included claims.

Specific implementations shown and described are only examples and should not be construed as the only way to implement or partition the present disclosure into functional elements unless specified otherwise in this disclosure. a person of ordinary skill in the art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

In the following description, elements, circuits, and functions may be shown in block diagram form in order not to obscure the present disclosure in unnecessary detail. And block definitions and partitioning of logic between various blocks are exemplary of a specific implementation. It will be readily apparent to a person of ordinary skill in the art that the present disclosure may be practiced by numerous other partitioning solutions. A person of ordinary skill in the art would understand that information and signals may be represented using any of a variety of technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, where the bus may have a variety of bit widths and the present disclosure may be implemented on any number of data signals including a single data signal.

The illustrative functional units include logical blocks, modules, and circuits described in the embodiments disclosed in this disclosure to more particularly emphasize their implementation independence. The functional units may be implemented or performed with a general purpose processor, a special purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described in this disclosure. A general-purpose processor may be a microprocessor, any conventional processor, controller, microcontroller, or state machine. A general-purpose processor may be considered a special purpose processor while the general-purpose processor is configured to fetch and execute instructions (e.g., software code) stored on a computer-readable medium such as any type of memory, storage, and/or storage devices. A processor may also be implemented as a combination of computing devices, such as a combination of a DSP and a microprocessor, a plurality of microprocessors, one or more microprocessors in conjunction with a DSP core, or any other such configuration.

In addition, the illustrative functional units described above may include software or programs such as computer readable instructions that may be described in terms of a process that may be depicted as a flowchart, a flow diagram, a structure diagram, or a block diagram. The process may describe operational acts as a sequential process, many acts can be performed in another sequence, in parallel, or substantially concurrently. Further, the order of the acts may be rearranged. In addition, the software may comprise one or more objects, agents, threads, lines of code, subroutines, separate software applications, two or more lines of code or other suitable software structures operating in one or more software applications or on one or more processors. The software may be distributed over several code segments, modules, among different programs, and across several memory devices. Similarly, operational data may be identified and illustrated in this disclosure within modules and may be embodied in any suitable form and organized within any suitable data structure. The operational data may be collected as a single data set or may be distributed over different locations including over different storage devices.

Elements described in this disclosure may include multiple instances of the same element. These elements may be generically indicated by a numerical designator (e.g. 110) and specifically indicated by the numerical indicator followed by an alphabetic designator (e.g., 110A) or a numeric indicator preceded by a "dash" (e.g., 110-1). For ease of following the description, for the most part, element number indicators begin with the number of the drawing on which the elements are introduced or most discussed. For example, where feasible elements in FIG. 1 are designated with a format of 1xx, where 1 indicates FIG. 1 and xx designates the unique element.

It should be understood that any reference to an element in this disclosure using a designation such as "first," "second," and so forth does not limit the quantity or order of those elements, unless such limitation is explicitly stated. Rather, these designations may be used in this disclosure as a convenient method of distinguishing between two or more elements or instances of an element. A reference to a first and second element does not mean that only two elements may be employed or that the first element must precede the second element. In addition, unless stated otherwise, a set of elements may comprise one or more elements.

Reference throughout this specification to "one embodiment", "an embodiment" or similar language means that a particular feature, structure, or characteristic described in the embodiment is included in at least one embodiment of the present invention. Appearances of the phrases "one embodiment", "an embodiment" and similar language throughout this specification may, but do not necessarily, all refer to the same embodiment.

In the following detailed description, reference is made to the illustrations, which form a part of the present disclosure, and in which is shown, by way of illustration, specific embodiments in which the present disclosure may be practiced. These embodiments are described in sufficient detail to enable a person of ordinary skill in the art to practice the present disclosure. However, other embodiments may be utilized, and structural, logical, and electrical changes may be made without departing from the true scope of the present disclosure. The illustrations in this disclosure are not meant to be actual views of any particular device or system but are merely idealized representations employed to describe embodiments of the present disclosure. And the illustrations presented are not necessarily drawn to scale. And, elements common between drawings may retain the same or have similar numerical designations.

It will also be appreciated that one or more of the elements depicted in the drawings/figures can also be implemented in a more separated or integrated manner, or even removed or rendered as inoperable in certain cases, as is useful in accordance with a particular application. Additionally, any signal arrows in the drawings/figures should be considered only as exemplary, and not limiting, unless otherwise specifically noted. The scope of the present disclosure should be determined by the following claims and their legal equivalents.

As used herein, the terms "comprises," "comprising," "includes," "including," "has," "having," or any other variation thereof, are intended to cover a non-exclusive inclusion. For example, a process, product, article, or apparatus that comprises a list of elements is not necessarily limited only those elements but may include other elements not expressly listed or inherent to such process, product, article, or apparatus. Furthermore, the term "or" as used herein is generally intended to mean "and/or" unless otherwise indicated. For example, a condition A or B is satisfied by any one of the following: A is true (or present) and B is false (or not present), A is false (or not present) and B is true (or present), and both A and B are true (or present). As used herein, a term preceded by "a" or "an" (and "the" when antecedent basis is "a" or "an") includes both singular and plural of such term, unless clearly indicated otherwise (i.e., that the reference "a" or "an" clearly indicates only the singular or only the plural). Also, as used in the description herein, the meaning of "in" includes "in" and "on" unless the context clearly dictates otherwise.

To aid any Patent Office and any readers of any patent issued on this disclosure in interpreting the included claims, the Applicant(s) wish to note that they do not intend any of the appended claims or claim elements to invoke 35 U.S.C. 112(f) unless the words "means for" or "step for" are explicitly used in the particular claim.

DEFINITIONS

For the purposes of this disclosure we define the following terms:

Analytical function—A function that is treatable by or using the methods of algebra and calculus.

Axis-aligned orthotopes—A set, O, of n-dimensional orthotopes is axis-aligned if each of the underlying Cartesian coordinate system axis is parallel to one of the faces of every orthotope in O.

Axis-aligned orthotopic boundary distance constraint—A boundary distance constraint applied between two n-dimensional shapes that produces a boundary surface of closest approach between those shapes that is an n-dimensional axis-aligned orthotope.

Boundary distance constraint—A constraint between two n-dimensional objects that limits the distance between the surfaces, or boundaries, of the two objects.

Closed shape—A shape for which all paths starting from a point on one side of its surface and ending on that same point on the other side of its surface must pierce the surface of the shape.

Convex constraint—A constraint on an optimization problem where the set of points satisfying the constraint form a convex set.

Convex set—A set of points where all the points on a line segment connecting any two points in the set are also in the set.

Convex shape—A shape for which the straight-line segment connecting any two points on the surface of the shape must remain in the interior of the shape or on its surface.

Fixed-orientation shape—A shape which is not allowed to rotate.

Function—A function takes a set of one or more input values and produces an output value.

N-sphere—An n-dimensional generalization of a sphere where, for example, a circle is a 2-sphere and an ordinary, or 3-dimensional, sphere is a 3-sphere.

N-spheric boundary distance constraint—A boundary distance constraint which when applied between two n-dimensional shapes leads to a boundary surface of closest approach between those two shapes that is an n-sphere.

Normal vector—A vector, v, is normal to a surface, S, if it is perpendicular to all vectors lying in the plane tangent to the surface at the point of intersection between v and S.

Orthogonal—Intersecting or lying at right angles.

Orthotope—An n-dimensional, convex, faceted, closed shape where intersecting facets, or faces, are mutually orthogonal. In layman's terms an orthotope is an n-dimensional generalization of a rectangle.

Orthotopic boundary distance constraint—A boundary distance constraint which when applied between two n-dimensional shapes leads to a boundary surface of closest approach between those two shapes that is an n-dimensional orthotope.

Polytope—An n-dimensional, convex, faceted, closed shape. In layman's terms an polytope is an n-dimensional generalization of a polygon.

Subderivative—A generalization of the notion of a derivative for use on non-smooth curves. For smooth curves there is a single tangent line associated with each point on the curve. The slope of this line is the derivative at that point on the curve. For non-smooth curves there can be a set of tangent lines associated with each point on the curve. The slope of each line in the set is a subderivative.

Superellipsoid—The set of n-dimensional objects that can be analytically represented by an equation of the form:

$$\sum_{i=1}^{n} \left| 2\frac{x_i}{l_i} \right|^{z_i} = 1 \quad (1)$$

Two-dimensional examples, illustrated in FIG. 1A through FIG. 1F, include circles, ellipses, squares, and rectangles, as well as "squares with rounded corners" and "rectangles with rounded corners". Three-dimensional examples include spheres, ellipsoids, as well as cubes and boxes, illustrated in FIG. 1G and FIG. 1H, as well as "cubes with rounded corners" and "boxes with rounded corners".

Theoretical Motivation

To determine if arrangements of shapes satisfy exact or approximate analytical function representations of boundary distance constraints among those shapes, we will develop methods to generate analytic representation of BD constraints, or their approximations, between a pair of shapes. These methods will be based on the use of the boundary surface of closest approach (BSCA) between the pair of shapes and, when necessary, the use of analytical composition techniques.

For the remainder of this disclosure when a specific coordinate system is required to illustrate a concept we will assume, for the sake of brevity and clarity and without loss of generality, that the Cartesian coordinate system will be used unless stated otherwise. One skilled in the art will immediately see that the concepts could be demonstrated using alternate coordinate systems. Further, for the sake of clarity and brevity, this disclosure makes use of indexed notation in the representation of sums, unions, intersections, list, sets, etc. It will be assumed that the indexed entities, such as lists or sets, will contain no elements when the upper bound for an index is less than the lower bound for the index. For example, $\{x_1, x_2, \ldots x_n\} = \emptyset$ when $n<1$ and where $\emptyset$ represents the empty set. Similarly, an indexed mathematical operation will contain no terms when the upper bound for an index is less than the lower bound for the index. For example, $\sum_{i=1}^{n} x_i = x_1 + x_2 + \ldots x_n = 0$ when $n<1$. Finally, for the sake of brevity and clarity, this disclosure will make extensive use of vector notation to represent n-dimensional quantities such as, for example, n-dimensional Cartesian coordinates. These n-dimensional quantities will be represented as column vectors or, equivalently, transposed row vectors. As an example, the 3-dimensional Cartesian coordinate where x=1, y=2, and z=3 would be represented as either the column vector $$\vec{X} = \begin{bmatrix} 1 \\ 2 \\ 3 \end{bmatrix}$$

or the transposed row vector $\vec{X} = [1, 2, 3]^T$.

Analytic Representation of BD Constraints

There are two types of BSCA that exist between a pair of shapes, the exterior boundary surface of closest approach (EBSCA) and the interior boundary surface of closest approach (IBSCA). We can further divide these two types into unconstrained BSCAs, UEBSCA and UIBSCA, and constrained BSCAs, CEBSCA and CIBSCA. Roughly speaking, the UEBSCA, UIBSCA, CEBSCA, and CIBSCA between two shapes, $S_1$ and $S_2$, can be thought of as follows: the UEBSCA is the shape whose surface is traced out by the origin of $S_1$ as its exterior surface is "slid" along the exterior surface of $S_2$; the UIBSCA is the shape whose surface is traced out by the origin of $S_1$ as its exterior surface is "slid" along the interior surface of $S_2$; the CEBSCA is the shape whose surface is traced out by the origin of $S_1$ as its exterior surface is "slid" along the exterior surface of a shape whose exterior surface is derived from the exterior surface of $S_2$ and any additional boundary distance constraints between $S_1$ and $S_2$, and the CIBSCA is the shape whose surface is traced out by the origin of $S_1$ as its exterior surface is "slid" along the interior surface of a shape whose interior surface is derived from the interior surface of $S_2$ and any additional boundary distance constraints between $S_1$ and $S_2$. As will become clear shortly, one way to determine the CEBSCA, UIBSCA or CIBSCA between two shapes is to transform these problems into one or more UEBSCA problems. As a consequence, we will first concentrate on developing methods for determining UEBSCA.

Shapes

Before we can determine a BSCA between two shapes, we first need to define what we mean by a shape. We also need to determine how to represent a shape, and how we can combine two or more of these shapes to form a new shape.

Definition 1: An n-dimensional shape, S, consists of an equivalence relation and a point. The point is referred to as the origin of S, or Origin(S), and defines the position of S in the n-dimensional space. Based on the geometry of S and Origin(S) the equivalence relation subdivides the n-dimensional space into three disjoint sets referred to as the interior, exterior, and boundary sets. The exterior set, Exterior(S), consists of all points that are exterior to the shape. Those points not in Exterior(S), $\overline{\text{Exterior(S)}}$, are further subdivided into the boundary set, Boundary(S), and interior set, Interior(S). Boundary(S) contains all points in $\overline{\text{Exterior(S)}}$ that are immediately adjacent to a point in Exterior(S) and Interior(S) contains all points in $\overline{\text{Exterior(S)}}$ that are not in Boundary(S).

For brevity and convenience we will refer to the equivalence relation imposed by a shape S as Subdivision(S) and define it as the set containing the sets Interior(S), Exterior(S), and Boundary(S), or more precisely:

Subdivision(S)={Interior(S), Exterior(S), Boundary(S)} (2)

As will become apparent shortly, a useful subset of shapes is the set of convex shapes.

Definition 2: A convex shape S is a shape where all points on a line segment joining any pair of points in Boundary(S) must be in Boundary(S)∪Interior(S).

Based on Definition 1 we can define the union and intersection operations on shapes.

Definition 3: The union between shapes A and B, A∪B, produces a new shape, C. The origin of C is selected to be any finite point, possibly, but not necessarily, related to the origins of A and B. The Subdivision(C) is selected such that Interior(C)=Interior(A)∪Interior(B) Exterior(C)=Exterior(A)∩Exterior(B) Boundary(C)=(Boundary(A)∩$\overline{\text{Interior(B)}}$)∪(Boundary(B)∩$\overline{\text{Interior(A)}}$) (3)

Definition 4: The intersection between two shapes A and B, A∩B, produces a new shape, C. The origin of C is selected to be any finite point, possibly, but not necessarily, related to the origins of A and B. The Subdivision(C) is selected such that Interior(C)=Interior(A)∩Interior(B) Exterior(C)=Exterior(A)∪Exterior(B) Boundary(C)=(Boundary(A)∩Exterior(B))∪(Boundary(B)∩Exterior(A)) (4)

Based on Definitions 1 through 4, a large class of shapes can be defined as a union of convex shapes. We will refer to this as the class of all shapes of engineering interest, or for brevity, all shapes. Further, the intersection of any number of convex shapes is its self a convex shape. This implies that all shapes, S, can be represented as $S = \cup_{i=1,n}(\cap_{j=1,m_n} S_{i,j})$ (5)

where $S_{ij}$ are convex shapes. As such, any convex shape can be represented as the intersection of a possibly infinite number of "planar half spaces".

Definition 5: In general, a planar half space (PHS) associated with a shape S is a shape H where Origin(H)=Origin(S) and the Subdivision(H) is selected such that: Boundary(H) consists of all points on a plane dividing the space in half, where this plane is tangent to the surface of S at a point $\vec{P}$ in Boundary(S); Interior(H) consists of the half space on the side of Boundary(H) that contains those points in Interior(S) that are immediately adjacent to $\vec{P}$; Exterior(H) consists of the half space on the side of Boundary(H) that contains those points in Exterior(S) that are immediately adjacent to $\vec{P}$. More specifically, a planar half space (PHS) associated with a convex shape S is a shape H where Origin(H)=Origin(S) and the Subdivision(H) is selected such that: Boundary(H) consists of all points on a plane dividing the space in half, where this plane is tangent to Boundary(S); Interior(S) ⊆Interior(H) and Interior(H) also contains all points on the boundary of S except for the tangent points.

Shape Spectrums

We can represent a convex shape in terms of a set of PHSs. This set of PHSs can be represented using the origin of the shape along with the shape's shape spectrum.

Definition 6: The tangent planar half space spectrum, or for brevity, shape spectrum, of a shape is a function which represents some or all of the form of the shape relative to its origin. A shape spectrum is a function that relates a direction to a distance. The direction represents the direction of a vector passing through the origin of the shape. The magnitude of the distance returned by a shape spectrum for a given direction is the magnitude of the distance, measured along the vector, between the origin and the boundary plane of a PHS, H, to which the vector is normal. The sign of the distance returned by a shape spectrum for a given direction is negative when the origin of the shape is contained in Exterior(H) and positive when the origin of the shape is contained in Interior(H). We will refer to the distance returned by a shape spectrum for a given direction as the normal distance for that direction.

To determine a shape spectrum from its underlying shape we define the transformation $\mathcal{T}(S) \rightarrow \mathcal{S}(\vec{\theta})$ (6)

which takes a shape S, in the shape domain, and transforms it to a shape spectrum, $\mathcal{S}(\theta)$, in the tangent PHS domain where $\vec{\theta} = [\theta_1, \ldots \theta_{1-1}]^T$ defines the direction of a vector through the origin of the n-dimensional shape S. For the sake of clarity and brevity and without loss of generality we will assume that $\vec{\theta}$ is defined in terms of hyperspherical coordinates and all angles are measured in degrees. Note that when n=2, $\vec{\theta}$ reduces to a scalar, θ, whose value is $\theta_1$, the value of the single element of $\vec{\theta} = [\theta_1]^T$.

Figure 2:
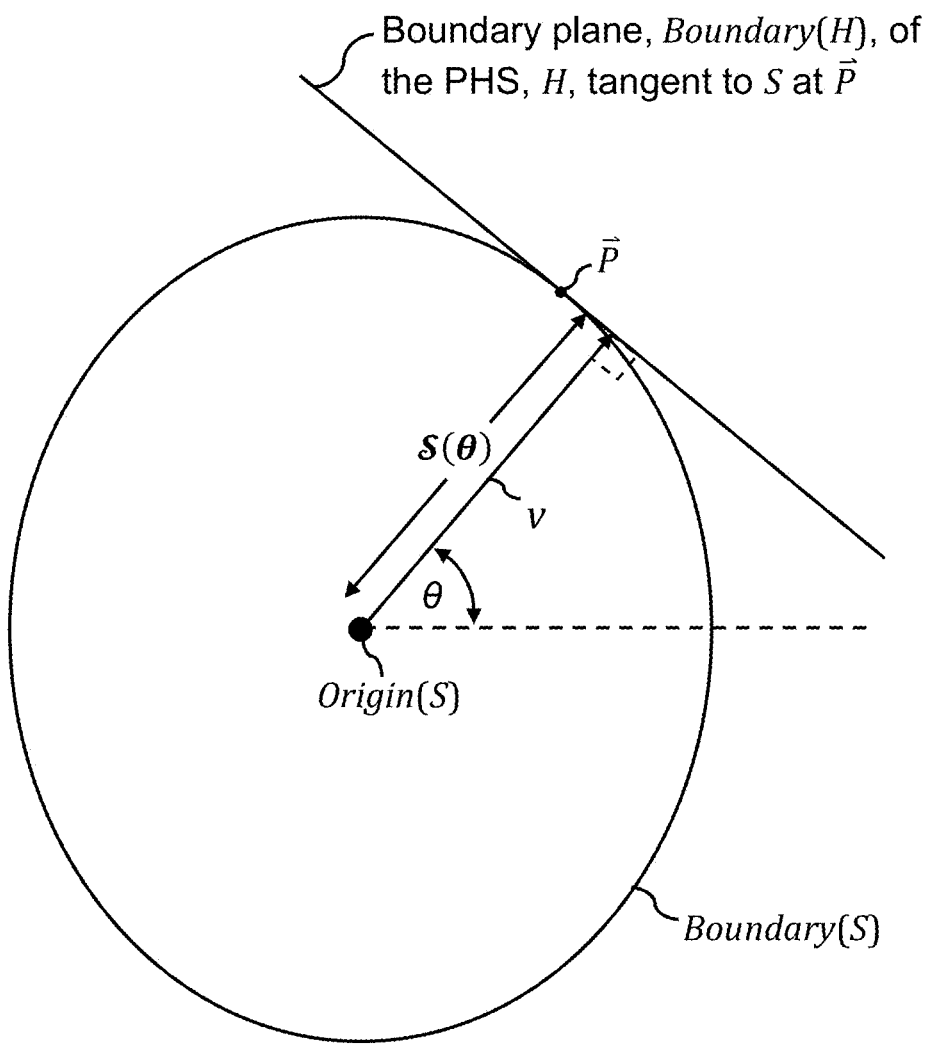
FIG. 2 illustrates the basic concepts of a shape spectrum on a two-dimensional shape.

To illustrate the basic concepts, consider the two-dimensional example in FIG. 2 where we show the boundary of a convex shape S with a vector v passing through Origin(S) pointing in direction θ. Vector v is normal to the boundary plane, Boundary(H), of the PHS, H, that is tangent to Boundary(S) at point $\vec{P}$. The normal distance between Origin(S) and the boundary plane B along v is $\mathcal{S}(\theta)$ where $\mathcal{S}(\theta)$ is always positive since Origin(S) E Interior(H) for all values of θ.

As a simple example of a shape spectrum for a two-dimensional shape, consider a circle of radius one with its origin at the center of the circle. This shape would have the following shape spectrum: $\mathcal{S}(\theta) = 1$. As a simple three-dimensional example, consider the shape defined by a sphere of radius one with it origin at the center of the sphere. This shape would have the following shape spectrum:

$$\mathcal{S}\left(\begin{bmatrix} \theta_1 \\ \theta_2 \end{bmatrix}\right) = 1.$$

In these examples, for ease of understanding, we assumed that the origin of the shapes was in the shapes interior set, specifically, in the center of the set. This is not required. In fact, the origin may be anywhere. As a consequence, if the origin is in the exterior set of the shape, one or more of the values of its shape spectrum will be negative.

We define the inverse transformation $\mathcal{T}^{-1}(\mathcal{T}(S), Origin(S)) \rightarrow S$ (7)

where $\mathcal{T}^{-1}$ is a transformation that takes a shape spectrum $\mathcal{S}(\vec{\theta})$, in the tangent PHS domain, and a point of origin and transforms them into a shape S, in the shape domain when $\mathcal{S}(\vec{\theta})$ represents a convex shape.

Additionally, we define the following parameterized version of the transformation whose use will become clear shortly:

$$\mathcal{T}_{(S,\vec{\alpha})} \rightarrow \mathcal{S}(\vec{\theta}+\vec{\alpha}) \tag{8}$$

For shapes of finite volume, the distance between the origin of the shape and every tangent PHS must be finite. Conversely, for shapes with infinite volume the distance between the origin and a PHS tangent to the infinite portion of the boundary is infinite. Further, every point on a smooth section of the boundary of the shape is associated with exactly one tangent PHS and we assume that the infinite portion of a shapes boundary is smooth. Conversely, non-smooth shapes have points on the finite boundary which are associated with multiple tangent PHSs, specifically, the "focal" points of a "corner" in the finite boundary.

We now define the notions of dominant and non-dominant PHSs, infinite and finite dominant PHSs, as well as various characterizations of shape spectrums.

Definition 7: For a convex shape, a dominant PHS is a PHS that is tangent to the boundary of the shape and is necessary in order to define at least one point on the boundary of the shape. Conversely, a non-dominant PHS is any tangent PHS that is not necessary to define any point on the boundary of the shape. Further, dominant PHSs can be classified as finite or infinite. A finite dominant PHS is a PHS that is a finite distance from the origin of the shape. Conversely an infinite dominant PHS is a PHS that is an infinite distance from the origin of the shape.

Definition 8: For a convex shape with a finite number dimensions, a shape spectrum can be characterized as continuous, discrete or mixed. If a shape spectrum has only dominant PHSs then the spectrum can be characterized as continuous. If the shape spectrum consists of a finite number of finite dominant PHSs then the spectrum can be characterized as discrete. Finally, if the shape spectrum has an infinite number of finite dominant PHSs as well as one or more non-dominate PHSs, then the spectrum can be characterized as mixed.

Definitions 7 and 8 give us a compact approach for representing a convex shape when the shape's finite boundary is composed of a finite number of facets. In particular, since there are a finite number of facets on a convex polytope and each of the facets of a convex polytope corresponds to a dominant PHS, convex polytopes have discrete spectrums. Since the infinite PHSs, if any, and the distance to the non-dominant PHSs can be determined from the finite dominant PHSs we need only keep track of the position of the finite dominant PHSs. These finite dominant PHSs make up the discrete representation of its shape spectrum. For brevity we will refer to this discrete representation as a DR shape spectrum.

As a two-dimensional example, consider a fixed-orientation Cartesian coordinate system axis-aligned square of height one and width one with its origin at the center of the square. A DR shape spectrum would be:

$$\mathcal{S}(\theta) = \begin{cases} 0.5 & \theta = 0° \\ 0.5 & \theta = 90° \\ 0.5 & \theta = 180° \\ 0.5 & \theta = 270° \end{cases} \tag{9}$$

As a three-dimensional example, consider a fixed-orientation Cartesian coordinate system axis-aligned cube with width, height and depth equal to one and an origin located at its center. A DR shape spectrum would be:

$$\mathcal{S}(\vec{\theta}) = \begin{cases} 0.5 & \theta_1 = 0°, \theta_1 = 0° \\ 0.5 & \theta_1 = 90°, \theta_2 = 0° \\ 0.5 & \theta_1 = 180°, \theta_2 = 0° \\ 0.5 & \theta_1 = 270°, \theta_2 = 0° \\ 0.5 & \theta_1 = 0°, \theta_2 = 90° \\ 0.5 & \theta_1 = 0°, \theta_2 = 270° \end{cases} \tag{10}$$

Assuming a spherical coordinate system in which $\theta_1$ represents the angle of rotation about the Z axis measured from the positive X axis, and $\theta_2$ represents the angle of inclination measured from the XY plane.

Since, in a hyperspherical coordinate system, each direction can be represented by an infinite number of values for the vector of angles, $\vec{\theta}$, it will be assumed, for ease of understanding and without loss of generality, that all angles will be represented in their canonical form and all mathematical operations on these angles that produce an angle vector will produce them in canonical form. In the two dimensional case this would mean, for example, that all angles, θ, are restricted to the range $0° \le \theta < 360°$, and that, for example, 310°+180° would result in a value of 130° instead of 490°.

Boundary Surface Shapes

We will now look at how to determine the UEBSCA between two fixed orientation convex shapes. To do this we first need to clearly define the UEBSCA between two fixed orientation shapes.

Definition 9: The unconstrained exterior boundary surface of closest approach (UEBSCA) between two fixed orientation shapes A and B, A⊙B, is a new shape, C, where Origin(C)=Origin(A) and Subdivision(C) is selected such that:

Interior(C) contains all points defined by the location of Origin(B) for all positionings of B, while maintaining the position of A and the orientations of both A and B, such that Interior(A)∩Interior(B)≠Ø, where Ø represents the empty set. That is, the set of locations of the origin of B as B is moved around in a fixed orientation such that the interiors of A and B overlap.

Exterior(C) contains all points defined by the location of Origin(B) for all positionings of B, while maintaining the position of A and the orientations of both A and B, such that Boundary(A)∩Boundary(B)=Ø and Interior(A)∩Interior(B)=Ø. That is, the set of locations of the origin of B as B is moved around in a fixed orientation such that A and B do not "touch" and their interiors do not overlap.

Boundary(C) contains all points defined by the location of Origin(B) for all positionings of B, while maintaining the position of A and the orientations of both A and B, such that Boundary(A)∩Boundary(B)≠Ø and Interior(A)∩Interior(B)=Ø. That is, the set of locations of the origin of B as B is moved around in a fixed orientation such that A and B "touch" and their interiors do not overlap.

From Definition 9 it can also be observed that the UEBSCA operation is not commutative, that is, in general $$A \odot B \ne B \odot A \tag{11}$$

Figure 3:
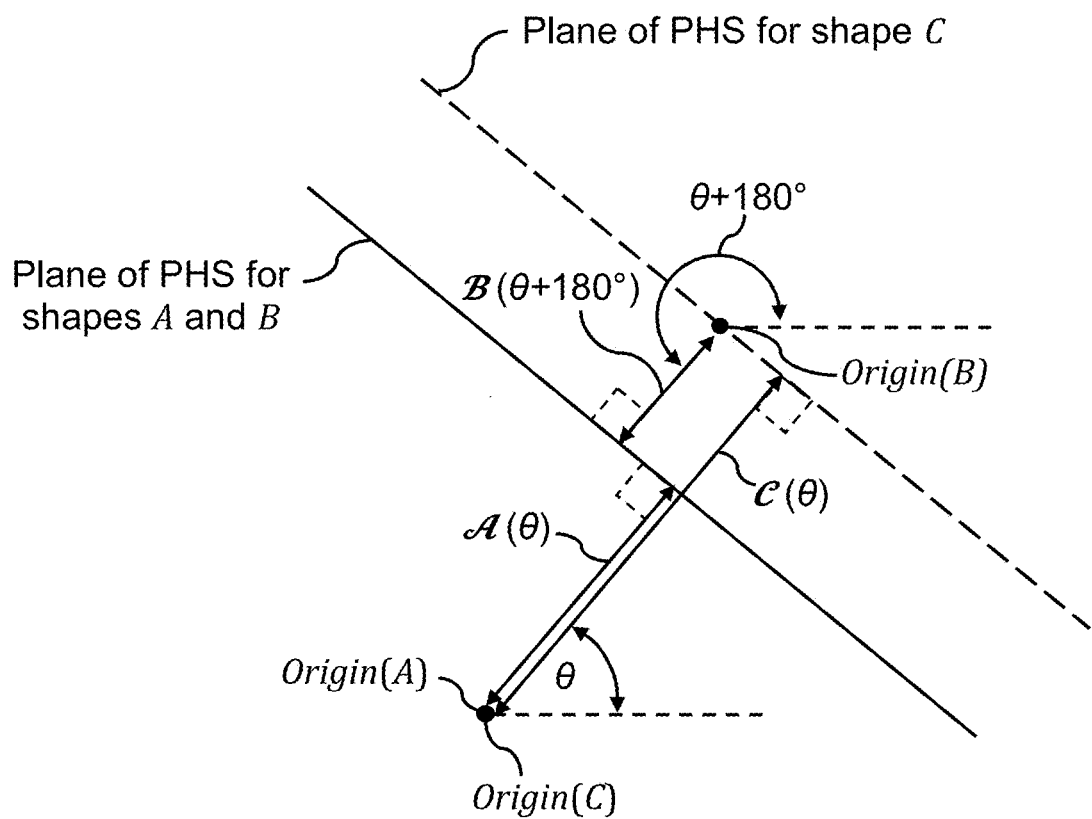
FIG. 3 illustrates the construction of the unconstrained exterior boundary surface of closest approach between two parallel planar half spaces.

Now let us consider the interaction between two shapes, A and B, that are PHSs. The shape spectrum of a PHS is a continuous spectrum with exactly one dominant PHS a finite distance from its origin. Further, the conditions for which the UEBSCA between these shapes, A⊙B, is "well defined" are when the two PHSs are parallel and facing in opposite directions. Under these conditions a shape C, produced by C=A⊙B, is itself a PHS. The normal distance from the origin of C to its defining plane is the sum of the distances between the origin of each shape, A and B, and their corresponding defining plane, as illustrated in FIG. 3 for the two-dimensional case.

For those cases where the defining planes of A and B are not parallel, or are parallel but face in the same direction, the resulting shape, C=A⊙B, has an empty exterior set. That is, B would have to be placed an infinite distance from A to avoid overlapping. This circumstance is represented by a shape spectrum for C where all values of the spectrum are infinite.

Figure 4:
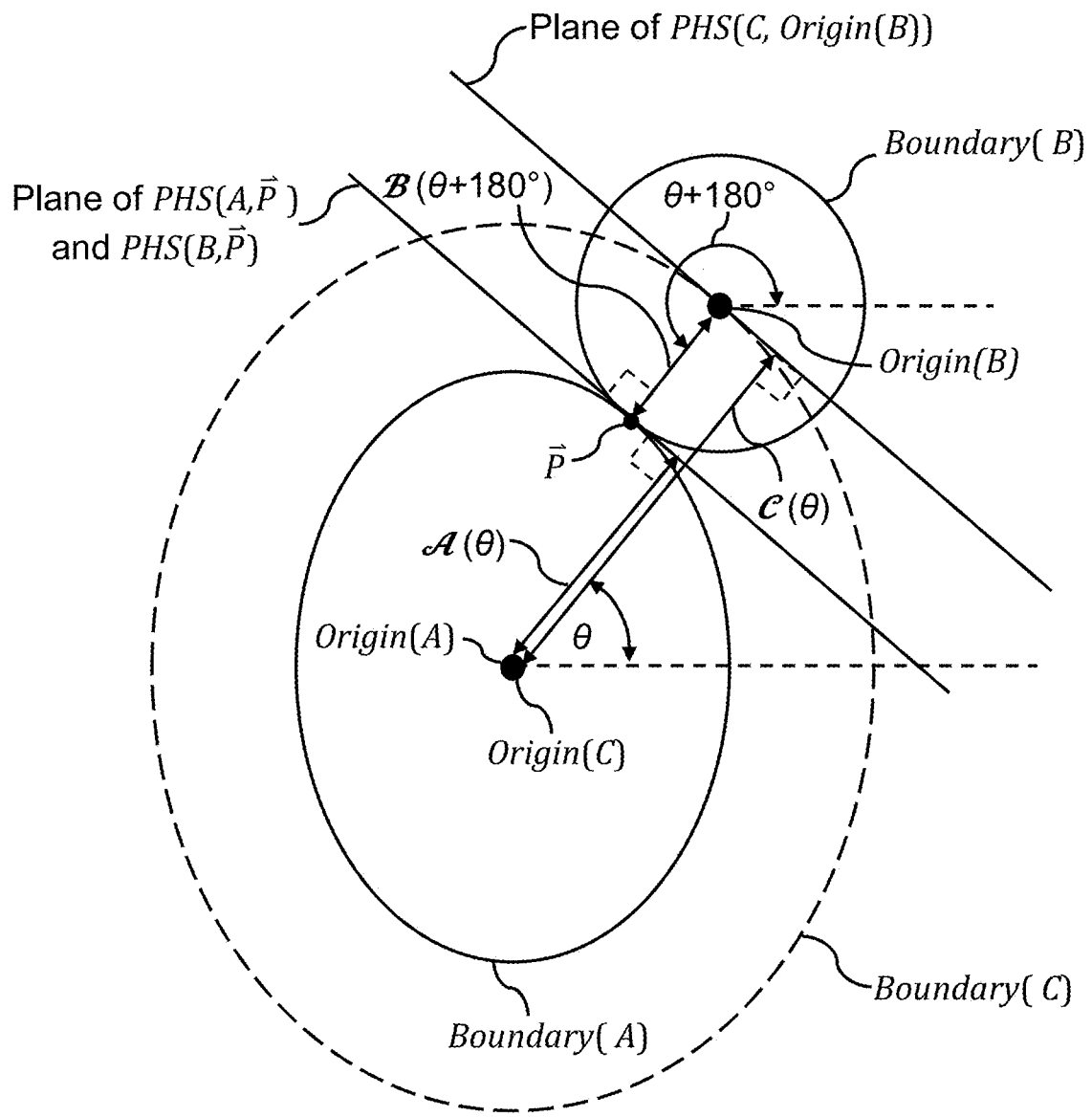
FIG. 4 illustrates the determination of one of the planar half spaces that makes up the unconstrained exterior boundary surface of closest approach formed by two two-dimensional convex shapes.
Figure 5A:
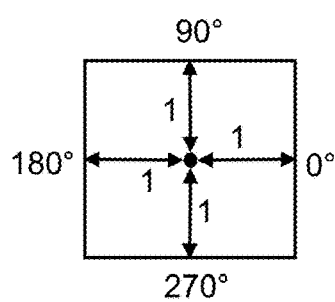
FIG. 5A-5D illustrate the construction of the shape and a discrete representation of its shape spectrum for the unconstrained exterior boundary surface of closest approach formed by a square and an equilateral triangle.
Figure 5A:
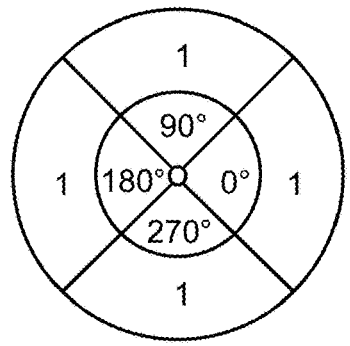
Figure 5B:
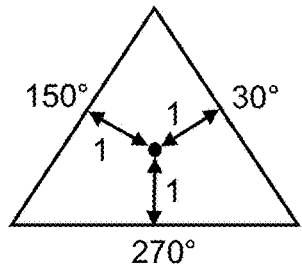
Figure 5B:
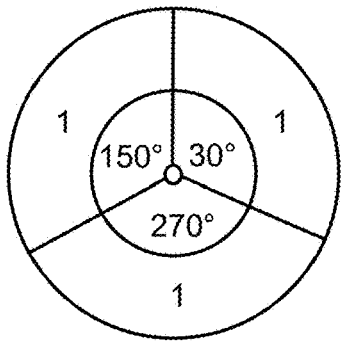
Figure 5C:
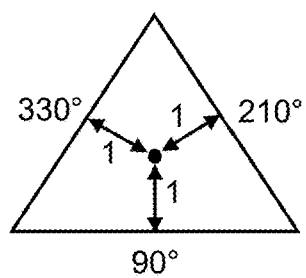
Figure 5C:
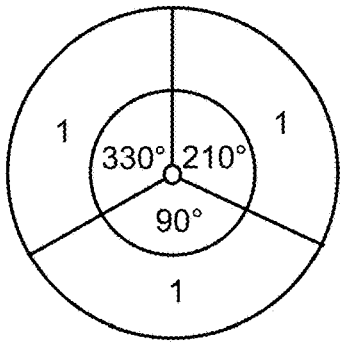
Figure 5D:
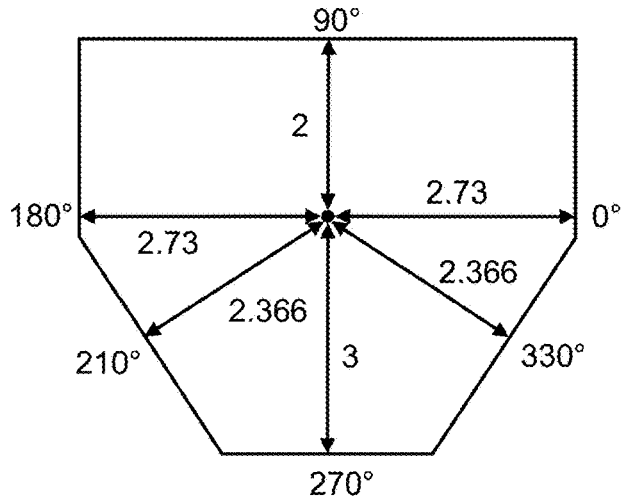
Figure 5D:
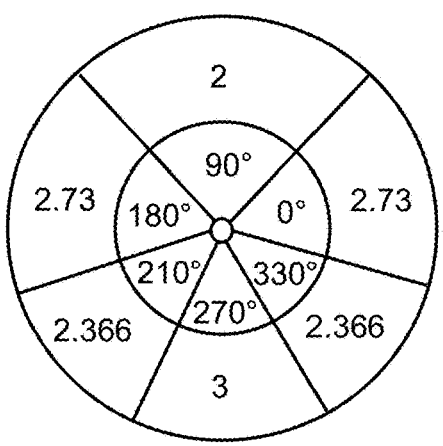

Going one step further and considering any two convex shapes, A and B, as illustrated by the 2-dimensional example in FIG. 4, C=A⊙B is also a convex shape. Further, at any tangent point, $\vec{P}$, of A and B the tangent PHSs of A and B associated with this point, PHS(A, $\vec{P}$) and PHS(B, $\vec{P}$), must be parallel and face in opposite directions. The boundary point defined by the position of the origin of B, Origin (B), when B is tangent to A at $\vec{P}$, is one of the points in the boundary set of C and must lie on a plane parallel to PHS(A, $\vec{P}$) and PHS(B, $\vec{P}$). Since A, B, and C are convex, this plane does not intersect the interior of C and therefore defines a tangent PHS of C, PHS(C, Origin(B)). The normal distance, $\mathcal{C}(\vec{\theta})$, of PHS(C, Origin(B)) from Origin(C) is the sum of the normal distance from the Origin(A) to PHS(A, $\vec{P}$), $\mathcal{A}(\vec{\theta})$, and the normal distance from the Origin(B) to PHS(B, $\vec{P}$), $\mathcal{B}(\vec{\theta}+\overrightarrow{180})$. Finally, PHS(C, Origin(B)) faces in the same direction as PHS(A, $\vec{P}$). Note that for notational convenience we use $\overrightarrow{180}$ to mean a constant vector all of whose elements equal 180.

From the reasoning outlined above the shape spectrum of C=A⊙B can be determined as $$\mathcal{C}(\vec{\theta}) = \mathcal{T}_{(A \odot B)} = \mathcal{T}_{(A)} + \mathcal{T}_{(B, \overrightarrow{180})} \quad (12)$$

and the shape C=A⊙B can be determined as $$C = A \odot B = \mathcal{T}^{-1}(\mathcal{T}_{(A)} + \mathcal{T}_{(B, \overrightarrow{180})}, Origin(A)) \quad (13)$$

We will now look at the behavior of C=A⊙B when both A and B are convex polytopes. First, C is its self a convex polytope. Since convex polytopes have discrete shape spectrums, the finite dominant PHSs of C can be determined directly from the finite dominant PHSs of both A and B. In general, for n-dimensional polytopes, the finite dominant PHSs of C are determined by the interaction of the n−1, n−2, . . . 0 dimensional features of shapes A and B. These features are, in turn, determined through the interaction of the finite dominant PHSs. For two dimensional polytopes (polygons) these features include one dimensional edges and zero dimensional points, or corners, where each edge is defined by the "plane" of a dominant PHS, and each corner is defined by the intersection of two dominant PHS "planes". Further, if A has m finite dominant PHSs (one corresponding to each of A's facets), and B has n finite dominant PHSs then C has as few a zero finite dominant PHSs and at most m+n finite dominant PHSs. The finite dominant PHSs of C are determined from the interaction of an edge of A and an edge of B, or an edge of A and a corner of B, or an edge of B and a corner of A.

For the two-dimensional case, one approach to determining the dominant PHSs of shape C is as follows:

Procedure 1: Represent the DR shape spectrums of A, B, and C as "circular" lists. These lists are organized in increasing order of angle between 0°≤θ<360°, of PHS angle and corresponding PHS normal distance from the origin of the shape. Next, rotate each element of list B by 180°. This can be accomplished by adding 180° to each elements angle and then map any angle greater than or equal to 360° to its equivalent angle between 0°≤θ<360°. For each element in list A see if there is an element in list B with the same angle, φ. If there is, mark the element in B, then add a PHS element to list C whose normal distance is the sum of the normal distances of the corresponding elements of list A and B and whose angle is φ. If there is no element in list B with the angle φ, then we will need to generate the PHS of B associated with φ using the dominant PHS information in list B. To do this, we first need to determine if the missing PHS is finite non-dominant or infinite dominant. If it is infinite dominant, then any new element for list C would also be infinite dominant and would not need to be included in list C. If it is finite non-dominant, then any new element would be finite dominant and would need to be added to list C. To determine which case we are working with, we find the two elements of list B that would be the predecessor and successor elements of the element from list A if it were in list B. We then check to see if these two elements have an angle between them that is less than 180°. If so, then the missing PHS is finite non-dominant and we need to generate a new element in list C for the angle φ. Using linear algebra and trigonometry we can determine $\mathcal{B}$ (φ+180°), the normal distance from the origin of B to the plane parallel to the PHS from A that intersects the planes of the two adjacent elements from B. With this distance, we can now generate the new element in C as outlined above. After all elements of list A have been processed, we need to process any of the elements of list B that have not been marked. For each of these elements from list B, we need to generate the missing PHS information in list A and, if necessary, generate new elements in list C as outlined above.

As an example, consider the case illustrated in FIG. 5. In this case, we are interested in determining the dominant PHSs for the UEBSCA between a square and an equilateral triangle as it is moved around the square. FIG. 5A illustrates the square, its DR shape spectrum and circular list representation of that DR shape spectrum. FIG. 5B illustrates the equilateral triangle, its DR shape spectrum and the circular list representation of that DR shape spectrum. FIG. 5C illustrates the triangle, its DR shape spectrum and its circular list representation, after its DR shape spectrum has been rotated 180°. From the DR shape spectrums of FIG. 5A and FIG. 5C, we can see that the dominant PHS's of the UEBSCA will be at 0°, 90°, 180°, 210°, 270°, and 330°. FIG. 5D illustrates the shape of the UEBSCA, its DR shape spectrum, and circular list representation.

We will now look at the most general case for determining the UEBSCA between two shapes, A and B. In particular, we are interested in how to determine A⊙B when A can be either convex or non-convex and B can be either convex or non-convex. To do this we will need to first look at the behavior of UEBSCA when it is applied between the unions of shapes. Recall that non-convex shapes can be represented as the union of a possible infinite number of convex shapes. Because of this either, or both, of A and B can be converted into a union of convex shapes. However, in order for this conversion to be useful we will need to look at the behavior of UEBSCA when it is applied between the unions of shapes.

From Definitions 3 and 9 we have that $$Interior((A_1 \cup A_2) \odot B) = Interior((A_1 \odot B) \cup (A_2 \odot B)) \quad (14)$$

and by extension $$Interior((\cup_{i=1,n} A_i) \odot B) = Interior(\cup_{i=1,n} (A_i \odot B)) \quad (15)$$

However, in general $$Interior(A \odot (B_1 \cup B_2)) \neq Interior((A \odot B_1) \cup (A \odot B_2)) \quad (16)$$

This is due to the fact that $B_1$ and $B_2$ may not share a common origin. However, if $B_1$ and $B_2$ share a common origin, $Origin(B_1) = Origin(B_2)$, then $$Interior(A \odot (B_1 \cup B_2)) = Interior((A \odot B_1) \cup (A \odot B_2)) \quad (17)$$

and by extension $$Interior(A \odot (\cup_{j=1,m} B_j)) = Interior(\cup_{j=1,m} (A \odot B_j)) \quad (18)$$

Substituting $A = \cup_{i=1,n} A_i$ into Equation (18) we have $$Interior((\cup_{i=1,n} A_i) \odot (\cup_{j=1,m} B_j)) = Interior(\cup_{j=1,m} (\cup_{i=1,n} (A_i \odot B_j))) \quad (19)$$

Based on Equation (15) and Equation (19) we have $$Interior((\cup_{i=1,n} A_i) \odot (\cup_{j=1,m} B_j)) = Interior(\cup_{j=1,m} (\cup_{i=1,n} (A_i \odot B_j))) \quad (20)$$

or, more concisely, $$Interior\left(\left(\bigcup_{i=1,n} A_i\right) \odot \left(\bigcup_{j=1,m} B_j\right)\right) = Interior\left(\bigcup_{\substack{i=1,n \\ j=1,m}} (A_i \odot B_j)\right) \quad (21)$$

when $Origin(\cup_{j=1,m} B_j) = Origin(B_1) = \ldots = Origin(B_m)$.

With this result and the fact that non-convex shapes can be represented as the union of a possible infinite number of convex shapes we have the necessary tools to determine the UEBSCA between two shapes, A and B, regardless of their convexity.

Procedure 2: Decompose A into a set of convex shapes, $\{A_1, \ldots A_n\}$, such that $A = \cup_{i=1,n} A_i$. Decompose B into a set of convex shapes, $\{B_1, \ldots B_m\}$, where $Origin(B_1) = \ldots = Origin(B_m) = Origin(B)$ and $B = \cup_{j=1,m} B_j$. From these two sets of shapes the UEBSCA between A and B can be determined as $$A \odot B = \bigcup_{\substack{i=1,n \\ j=1,m}} (A_i \odot B_j) \quad (22)$$

For completeness, it should also be noted that in general $\odot$ is not distributive over $\cap$. That is, in general $$Interior\left(\left(\bigcap_{i=1,n} A_i\right) \odot \left(\bigcap_{j=1,m} B_j\right)\right) \neq Interior\left(\bigcap_{\substack{i=1,n \\ j=1,m}} (A_i \odot B_j)\right) \quad (23)$$

One notable and important specific case where $\odot$ is distributive over $\cap$ is for the case where all $A_i$ and $B_j$ are axis aligned orthotopes such that all $B_j$ share a common origin.

We will now look at how to determine the UIBSCA between two fixed orientation shapes. To do this, we first need to clearly define the UIBSCA between two fixed orientation shapes, as well as the inversion operation on a shape.

Definition 10: The unconstrained interior boundary surface of closest approach (UIBSCA) between two fixed orientation shapes A and B, $A \circledcirc B$, is a new shape, C, where $Origin(C) = Origin(A)$ and $Subdivision(C)$ is selected such that:

Interior(C) contains all points defined by the location of Origin(B) for all positionings of B, while maintaining the position of A and the orientations of both A and B, such that $Interior(B) \cap Exterior(A) = \emptyset$ and $Boundary(A) \cap Boundary(B) = \emptyset$. That is, the set of locations of the origin of B as B is moved around in a fixed orientation such that A and B don't "touch" and the interior of B does not overlap the exterior of A.

Exterior(C) contains all points defined by the location of Origin(B) for all positionings of B, while maintaining the position of A and the orientations of both A and B, such that $Interior(B) \cap Exterior(A) \neq \emptyset$. That is, the set of locations of the origin of B as B is moved around in a fixed orientation such that the interior of B overlaps the exterior of A.

Boundary(C) contains all points defined by the location of Origin(B) for all positionings of B, while maintaining the position of A and the orientations of both A and B, such that $Boundary(A) \cap Boundary(B) \neq \emptyset$ and $Interior(B) \cap Exterior(A) = \emptyset$. That is, the set of locations of the origin of B as B is moved around in a fixed orientation such that A and B "touch" and the interior of B does not overlap the exterior of A.

From Definition 10 it can also be observed that the UIBSCA operation is not commutative, that is, in general $$A \circledcirc B \neq B \circledcirc A \quad (24)$$

Definition 11: The inversion of a shape A, $\overline{A}$, produces a new shape, C, where $Origin(C) = Origin(A)$ and Subdivision (C) is selected such that $$Interior(C) = Exterior(A) \; Exterior(C) = Interior(A) \\ Boundary(C) = Boundary(A) \quad (25)$$

Using this in combination with the Definitions 9 and 10 we have that $$A \circledcirc B = \overline{A} \odot B \quad (26)$$

From this we see that $A \circledcirc B$ can be solved using all the machinery developed to solve $A \odot B$.

Analytical Shape Functions

Now that we have a way to determine the shape of UEBSCA or UIBSCA between a pair of shapes, we need an analytical representation for these boundary shapes.

Definition 12: The analytical shape function or, for brevity, shape function, $\mathbb{S}(\vec{X}, \vec{O})$, for a shape S is a mapping which can be used to determine if a point $\vec{X}$ is in the Interior(S), Exterior(S), or Boundary(S) when $Origin(S) = \vec{O}$.

One approach to this mapping is to define $\mathbb{S}(\vec{X}, \vec{O})$ for a shape S such that:

$$Interior(S) = \{\vec{X} \mid 0 \leq \mathbb{S}(\vec{X}, \vec{O}) < 1\} \quad (27)$$

$$Boundary(S) = \{\vec{X} \mid \mathbb{S}(\vec{X}, \vec{O}) = 1\} \quad (28)$$

$$Exterior(S) = \{\vec{X} \mid \mathbb{S}(\vec{X}, \vec{O}) > 1\} \quad (29)$$

As an example, consider the two-dimensional shape which is a circle of radius one with its origin, $$\begin{bmatrix} o_1 \\ o_2 \end{bmatrix},$$

located at the center of the circle. An analytical shape function defined on the Cartesian coordinate system that represents this shape and satisfies Equations (27), (28), and (29) is $$\mathbb{S}\left(\begin{bmatrix} x_1 \\ x_2 \end{bmatrix}, \begin{bmatrix} o_1 \\ o_2 \end{bmatrix}\right) = (x_1 - o_1)^2 + (x_2 - o_2)^2 \quad (30)$$

One skilled in the art will immediately see that there are many equally valid alternate mappings that can define a shape function, as for example the mapping $$Interior(S) = \{\vec{X} \mid \mathbb{S}(\vec{X}, \vec{O})_{>1}\} \quad (31)$$

$$Boundary(S) = \{\vec{X} \mid \mathbb{S}(\vec{X}, \vec{O})_{=1}\} \quad (32)$$

$$Exterior(S) = \{\vec{X} \mid 0 \leq \mathbb{S}(\vec{X}, \vec{O})_{<1}\} \quad (33)$$

or $$Interior(S) = \{\vec{X} \mid \mathbb{S}(\vec{X}, \vec{O})_{<0}\} \quad (34)$$

$$Boundary(S) = \{\vec{X} \mid \mathbb{S}(\vec{X}, \vec{O})_{=0}\} \quad (35)$$

$$Exterior(S) = \{\vec{X} \mid \mathbb{S}(\vec{X}, \vec{O})_{>0}\} \quad (36)$$

For the remainder of this disclosure when a specific mapping is required to illustrate a concept we will assume, for the sake of brevity and clarity and without loss of generality, that the shape functions are defined by the mapping of Equations (27), (28), and (29) unless stated otherwise. One skilled in the art will immediately see that these concepts could be demonstrated with many other alternate mappings or, where applicable, combinations of alternate mappings.

Analytical Composition of Shapes

Since UEBSCAs and UIBSCAs can be composed of multiple shapes using intersections, unions and inversions, we also need analytical methods for composing analytical shape functions using analytical intersections, inversions and unions. We will refer to the process of constructing analytical shape functions using analytical intersections and/or analytical unions as analytical composition.

Definition 13: An analytical intersection for a set of analytical shape functions, $\{\mathbb{S}_1(\vec{X}, \vec{O}_1)), \ldots \mathbb{S}_n(\vec{X}, \vec{O}_n)\}$, for the set of shapes $\{S_1, \ldots S_n\}$, Intersect $(\mathbb{S}_1(\vec{X}, \vec{O}_1), \ldots \mathbb{S}_n(\vec{X}, \vec{O}_n))$, is a function that can be used to determine if a point is in Interior($\cup_{i=1,n}S_i$), Exterior($\cup_{i=1,n}S_i$), or Boundary($\cup_{i=1,n}S_i$) when Origin($S_1$)=$\vec{O}_1, \ldots$ Origin($S_n$)=$\vec{O}_n$.

One function that captures the spirit of Definition 13 that can perform an approximate analytical intersection for a set of shape functions is $$\text{Intersect}(\mathbb{S}_1(\vec{X}, \vec{O}_1), \ldots \mathbb{S}_n(\vec{X}, \vec{O}_m)) \approx \quad (37)$$
$$\lim_{U_1, \ldots U_m \to \infty} (\mathbb{S}_1(\vec{X}, \vec{O}_1)^{U_1} + \ldots + \mathbb{S}_m(\vec{X}, \vec{O}_m)^{U_m})$$

The characteristics that cause this to be an approximation stem from the fact that for any point, $\vec{X}$, on the boundary of more than one shape of the intersection, we would expect that point to be on the boundary of the shape formed by the intersection, however, from Equation (37) we see that $\vec{X}$ will be mapped to a point in the exterior of the intersection. However, in practice, for large finite values of $\{U_1, \ldots U_m\}$, the resulting sets will be sufficiently close to the desired sets for engineering purposes.

Definition 14: An analytical inversion of an analytical shape function, $\mathbb{S}(\vec{X}, \vec{O})$, for the shape S is a function, Invert $(\vec{X})$, that can be used to determine if a point is in the Interior($\overline{S}$), Exterior($\overline{S}$), or Boundary($\overline{S}$) when Origin (S)=$\vec{O}$.

One function that satisfies Definition 14 is $$\text{Invert}(\mathbb{S}(\vec{X}, \vec{O})) = \frac{1}{\mathbb{S}(\vec{X}, \vec{O})} \quad (38)$$

Definition 15: An analytical union of a set of analytical shape functions, $\{\mathbb{S}_1(\vec{X}, \vec{O}_1), \ldots \mathbb{S}_n(\vec{X}, \vec{O}_n)\}$, for the set of shapes $\{S_1, \ldots S_n\}$, Union $(\mathbb{S}_1(\vec{X}, \vec{O}_1), \ldots \mathbb{S}_n(\vec{X}, \vec{O}_n))$, is a function that can be used to determine if a point is in Interior($\cup_{i=1,n}S_i$), Exterior($\cup_{i=1,n}S_i$), or Boundary($\cup_{i=1,n}S_i$) when Origin($S_1$)=$\vec{O}_1, \ldots$ Origin($S_n$)=$\vec{O}_n$.

Using DeMorgan's law and assuming Definitions 13 and 14 are satisfied using Equations (37) and (38), one function that captures the spirit of Definition 15 and can perform an approximate analytical union for a set of shape functions is $$\text{Union}(\mathbb{S}_1(\vec{X}, \vec{O}_1), \ldots \mathbb{S}_n(\vec{X}, \vec{O}_n)) = \quad (39)$$
$$\text{Invert}(\text{Intersect}(\text{Invert}(\mathbb{S}_1(\vec{X}, \vec{O}_1)), \ldots \text{Invert}(\mathbb{S}_n(\vec{X}, \vec{O}_n)))) \approx$$
$$\frac{1}{\lim_{R_1, \ldots R_n \to \infty} \left(\frac{1}{\mathbb{S}_1(\vec{X}, \vec{O}_1)^{R_1}} + \ldots + \frac{1}{\mathbb{S}_n(\vec{X}, \vec{O}_n)^{R_n}}\right)}$$

Again we note the approximate nature of Equation (39) and observe that, in practice, for large finite values of $\{R_1, \ldots, R_n\}$ the resulting sets will be sufficiently close to the desired sets for engineering purposes.

There are shape functions whose form makes its associated exponent, in Equations (37) or (39), unnecessary. For example, if the shape function $$\mathbb{S}_1\left(\begin{bmatrix} x_1 \\ x_2 \end{bmatrix}, \begin{bmatrix} o_1 \\ o_2 \end{bmatrix}\right) = \lim_{Q \to \infty}(|x_1 - o_1|^Q + |x_2 - o_2|^Q) \quad (40)$$

were one of the shapes to be intersected in Equation (37) or the union in Equation (38), the behavior of exponent Q would make the associated exponent in Equations (37) or (39), unnecessary and the exponent could either be eliminated or set to a constant. Conversely, if the shape function $$\mathbb{S}_1\left(\begin{bmatrix} x_1 \\ x_2 \end{bmatrix}, \begin{bmatrix} o_1 \\ o_2 \end{bmatrix}\right) = |x_1 - o_1|^2 + |x_2 - o_2|^2 \quad (41)$$

were one of the shapes to be intersected in Equation (37) or the union in Equation (38), its associated exponent in Equations (37) or (39), would be required. We will refer to shapes, such as the one in Equation (40), as self-composing shapes. From this we can see that shapes produced by an analytic union or analytic intersection are themselves self-composing.

Constructing Analytical Shape Functions

Since shapes can be composed of set of convex shapes, we now need methods for constructing analytical shape functions for convex shapes.

One method for constructing analytical shape functions for convex shapes relies on the fact that convex shapes are composed of the intersection of a possibly infinite number of PHSs. Further, the finite dominant PHSs of a shape's shape spectrum identify the minimum set of PHSs that will need to be intersected to form the shape. From this we can see that an analytical shape function of a convex shape can be composed from the analytical shape functions of its finite dominant PHSs.

One approach to determining an analytical shape function of a PHS that satisfies Equations (27), (28), and (29) is through the use of affine functions. In particular, for the PHS, PHS1, associated with direction $\vec{\theta}$ of an n-dimensional convex shape, S, with origin $\vec{O}$ we can construct a function $P_{\vec{\theta}}(\vec{X}, \vec{O})$, which is affine in $\vec{X}$, such that $P_{\vec{\theta}}(\vec{X}, \vec{O}) = 1$ for all $\vec{X}$ on the boundary of PHS1 and $P_{\vec{\theta}}(\vec{X}, \vec{O}) > 1$ for all $\vec{X}$ exterior to PHS1. To do this we need to determine a vector of n coefficients, $\vec{K}_{\vec{\theta}}$, and a scalar $K_{\vec{\theta}}$ which satisfy $$P_{\vec{\theta}}(\vec{X}, \vec{O}) = \vec{K}_{\vec{\theta}}^T \vec{X} + K_{\vec{\theta}} = 1 \forall \vec{X} \in Boundary \quad (42)$$
$$(PHS1)$$

$$P_{\vec{\theta}}(\vec{X}, \vec{O}) = \vec{K}_{\vec{\theta}}^T \vec{X} + K_{\vec{\theta}} > 1 \forall \vec{X} \in Exterior \quad (43)$$
$$(PHS1)$$

Using basic linear algebra and trigonometry it is possible to determine any number of $\vec{K}_{\vec{\theta}}$ and $K_{\vec{\theta}}$ that satisfy Equation (42) and (43).

For example, in the 2-dimensional case it is not hard to show that $$\vec{K}_{\vec{\theta}} = \begin{bmatrix} \cos\theta \\ \sin\theta \end{bmatrix} \quad (44)$$

$$K_{\theta} = -\vec{K}_{\vec{\theta}}^T \begin{bmatrix} o_1 \\ o_2 \end{bmatrix} - \mathcal{S}(\theta) + 1 \quad (45)$$

satisfy Equations (42) and (43) when $\mathcal{S}(\theta)$ is the normal distance from $$\vec{O} = \begin{bmatrix} o_1 \\ o_2 \end{bmatrix}$$

to the plane of PHS1 of S.

However, while $P_{\vec{\theta}}(\vec{X}, \vec{O})$ will correctly identify the boundary and exterior sets, it will not correctly identify the interior set since it maps all points, $\vec{X}$, in the interior of PHS1 to values in the range $-\infty < P_{\vec{\theta}}(\vec{X}, \vec{O}) < 1$ instead of the desired range $0 \le P_{\vec{\theta}}(\vec{X}, \vec{O}) < 1$. One way to rectify this is to define the analytical shape function for PHS1 to be $$\mathbb{P}_{\vec{\theta}}(\vec{X}, \vec{O}) = max\{0, P_{\vec{\theta}}(\vec{X}, \vec{O})\} \quad (46)$$

Using Equations (37) and (46), we can construct an analytical shape function for a convex shape, S, with a discrete shape spectrum having q finite dominant PHS's with directions $\vec{\theta}_1, \ldots \vec{\theta}_q$ as $$\mathbb{S}(\vec{X}, \vec{O}) = \lim_{Z_1, \ldots Z_q \to \infty} \left( \sum_{i=1}^{q} \mathbb{P}_{\vec{\theta}_i}(\vec{X}, \vec{O})^{Z_i} \right) \quad (47)$$

Equation (47) can produce a shape function which maps more than one point in the interior of the shape to a value of zero due to the use of the max function in Equation (46). In some applications it may be desirable for the shape function to have only a single point in the interior of a shape which maps to a value of zero. One way to produce a shape function with a unique minimum point, possibly zero, for a convex shape, S, having finite volume, is to first determine a point in the interior of the shape. One such point, the analytical center, can be readily determined using convex optimization methods. We can then compute the vector of coefficients and scalar in Equations (42) and (43) such that the shape function for each PHS of S passes through this point with a value greater than or equal to zero. If the shape function of each PHS of S passes through this point with a value of zero, then the corresponding shape function of S will have a unique minimum at this point whose value is zero.

A more compact representation exists for any n-dimensional convex shape, S, that has symmetric pairs of finite dominate PHSs. A symmetric pair of finite dominant PHSs for a shape S exists when there is a finite dominant PHS, call it PHS1, for some direction $\vec{\theta}$ and another finite dominant PHS, call it PHS2, for direction $\vec{\theta} + \overline{180}$. Under these circumstances we can construct a single affine function, $Q_{\vec{\theta}}(\vec{X}, \vec{O})$, which can be used to capture the interior, boundary, and exterior sets of PHS1∪PHS2. In particular, we can determine a vector of n coefficients, $\vec{K}_{\vec{\theta}}$ and a scalar $K_{\vec{\theta}}$ that satisfy $$Q_{\vec{\theta}}(\vec{X}, \vec{O}) = \vec{K}_{\vec{\theta}}^T \vec{X} + K_{\vec{\theta}} = 1 \forall \vec{X} \in Boundary(PHS1) \quad (48)$$

$$Q_{\vec{\theta}}(\vec{X}, \vec{O}) = \vec{K}_{\vec{\theta}}^T \vec{X} + K_{\vec{\theta}} > 1 \forall \vec{X} \in Exterior(PHS1) \quad (49)$$

$$Q_{\vec{\theta}}(\vec{X}, \vec{O}) = \vec{K}_{\vec{\theta}}^T \vec{X} + K_{\vec{\theta}} = -1 \forall \vec{X} \in Boundary(PHS2) \quad (50)$$

$$Q_{\vec{\theta}}(\vec{X},\vec{o}) = \vec{K}_{\vec{\theta}}^T \vec{X} + K_{\vec{\theta}} < -1 \forall \vec{X} \in Exterior(PHS2) \quad (51)$$

$$-1 < Q_{\vec{\theta}}(\vec{X},\vec{o}) = \vec{K}_{\vec{\theta}}^T \vec{X} + K_{\vec{\theta}} < 1 \forall \vec{X} \in (Interior(PHS1) \cap Interior(PHS2)) \quad (52)$$

The analytical representation of the intersection of PHS1 and PHS2 can then be compactly represented as $$\mathbb{Q}_{\vec{\theta}}(\vec{X},\vec{o}) = |Q_{\vec{\theta}}(\vec{X},\vec{o})| \quad (53)$$

For example, in the 2-dimensional case it is not hard to show that $$\vec{K}_{\vec{\theta}} = \frac{2}{S(\theta + 180°) + S(\theta)} \begin{bmatrix} \cos\theta \\ \sin\theta \end{bmatrix} \quad (54)$$

$$K_{\vec{\theta}} = -\vec{K}_{\vec{\theta}}^T \begin{bmatrix} o_1 \\ o_2 \end{bmatrix} + \frac{S(\theta + 180°) - S(\theta)}{S(\theta + 180°) + S(\theta)} \quad (55)$$

where $$\begin{bmatrix} o_1 \\ o_2 \end{bmatrix}$$

is the origin of S, and by extension the origins of both PHS1 and PHS2; $\theta$ is the direction of the normal vector from $$\begin{bmatrix} o_1 \\ o_2 \end{bmatrix}$$

to the plane of PHS1 of S; $S(\theta)$ is the normal distance from $$\begin{bmatrix} o_1 \\ o_2 \end{bmatrix}$$

to the plane of PHS1 of S; and $S(\theta+180°)$ is the normal distance from $$\begin{bmatrix} o_1 \\ o_2 \end{bmatrix}$$

to the plane of PHS2 of S.

One way to use Equations (46) and (53) to construct an analytical representation for a convex shape, S, with a discrete shape spectrum having r finite dominant PHSs is as $$\mathbb{S}(\vec{X},\vec{O}) = \lim_{\substack{Z_1,\ldots Z_q \to +\infty \\ Z_{q+1},\ldots Z_{q+p} \to \infty}} \left( \sum_{i=1}^{q} \mathbb{Q}_{\vec{\theta}_i}(\vec{X},\vec{O})^{Z_i} + \sum_{j=1}^{p} \mathbb{P}_{\vec{\theta}_j}(\vec{X},\vec{O})^{Z_{q+j}} \right) \quad (56)$$

where p and q are integers;

$$0 \le q \le \frac{r}{2};$$

at least q PHS's, with directions $\vec{\theta}_1, \ldots \vec{\theta}_q$, have corresponding symmetric PHSs with directions $\vec{\theta}_1 + \overline{180}, \ldots \vec{\theta}_q + \overline{180}$; the remaining p=r−2q finite dominant PHS's have directions $\vec{\theta}_1, \ldots \vec{\theta}_p$.

For a convex shape, S, with a continuous shape spectrum the summation in Equation (56) can be converted to an integration. As an example of this, consider the two-dimensional case where the shape spectrum, $\mathcal{S}(\theta)$, is symmetric. One way to determine this shape function is as $$\mathbb{S}\left( \begin{bmatrix} x_1 \\ x_2 \end{bmatrix}, \begin{bmatrix} o_1 \\ o_2 \end{bmatrix} \right) = \lim_{Z \to \infty} \left( \int_{0°}^{180°} Q_\theta \left( \begin{bmatrix} x_1 \\ x_2 \end{bmatrix}, \begin{bmatrix} o_1 \\ o_2 \end{bmatrix} \right)^Z d\theta \right) = \quad (57)$$

$$\lim_{Z \to \infty} \left( \int_{0°}^{180°} \left| \vec{K}_\theta^T \begin{bmatrix} x_1 \\ x_2 \end{bmatrix} + K_\theta \right|^Z d\theta \right) =$$

$$\lim_{Z \to \infty} \left( \int_{0°}^{180°} \left| \begin{array}{c} \frac{2\cos(\theta)}{S(\theta) + S(\theta + 180°)} x_1 + \\ \frac{2\sin(\theta)}{S(\theta) + S(\theta + 180°)} x_2 + \\ -2\cos(\theta)o_1 - 2\sin(\theta)o_2 + \\ \frac{S(\theta + 180°) - S(\theta)}{S(\theta) + S(\theta + 180°)} \end{array} \right|^Z d\theta \right)$$

Figure 6:
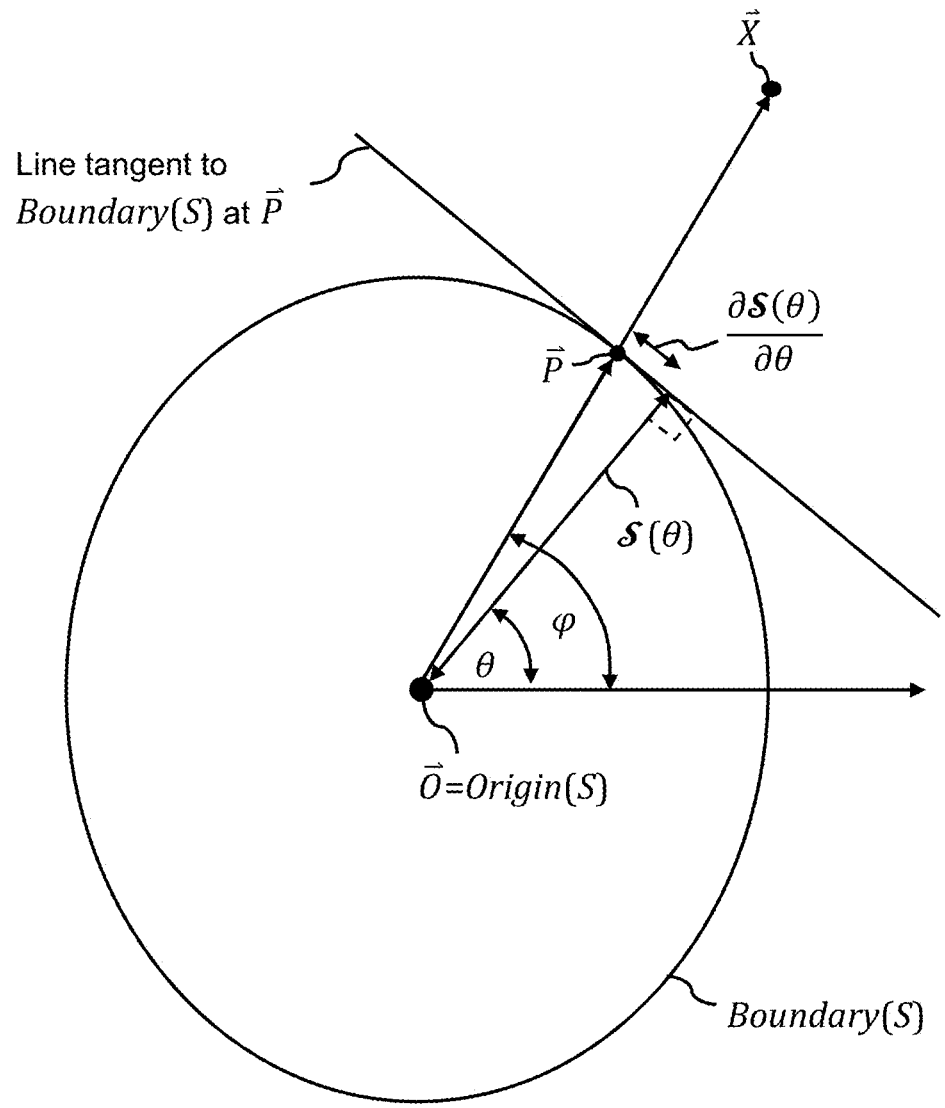
FIG. 6 illustrates the relationship of the various elements of one approach used to construct a shape function from a shape spectrum for a two-dimensional shape.

We will now consider a more direct approach to constructing analytical shape functions for convex shapes. In this approach, an analytical shape function is generated directly from a shape spectrum without the use of PHSs. We will illustrate this approach using the two-dimensional case. Specifically, it can be shown that for a two-dimensional shape S with origin $$\vec{O} = \begin{bmatrix} o_1 \\ o_2 \end{bmatrix}$$

and shape spectrum $\mathcal{S}(\theta) = \mathcal{T}(S)$, the boundary of S can be determined as $$Boundary(S) = \cup_{0° \le \theta < 360°} L(\theta, \vec{O}) \quad (58)$$

where $L(\theta, \vec{O})$ is the set of points defined by the line segment between the points $$\vec{A} = \begin{bmatrix} a_1(\theta, o_1) \\ a_2(\theta, o_2) \end{bmatrix} \text{ and } \vec{B} = \begin{bmatrix} b_1(\theta, o_1) \\ b_2(\theta, o_2) \end{bmatrix}$$

where $a_1(\theta, o_1)$, $a_2(\theta, o_2)$, $b_1(\theta, o_1)$, and $b_2(\theta, o_2)$ are defined by the following subdifferential equations:

$$a_1(\theta, o_1) = S(\theta)\cos(\theta) - \sin(\theta)\max\left\{\frac{\delta S(\theta)}{\delta \theta}\right\} + o_1 \quad (59)$$

$$a_2(\theta, o_2) = S(\theta)\sin(\theta) + \cos(\theta)\max\left\{\frac{\delta S(\theta)}{\delta \theta}\right\} + o_2 \quad (60)$$

$$b_1(\theta, o_1) = S(\theta)\cos(\theta) - \sin(\theta)\min\left\{\frac{\delta S(\theta)}{\delta \theta}\right\} + o_1 \quad (61)$$

$$b_2(\theta, o_2) = S(\theta)\sin(\theta) + \cos(\theta)\min\left\{\frac{\delta S(\theta)}{\delta \theta}\right\} + o_2 \quad (62)$$

where $$\frac{\delta S(\theta)}{\delta \theta}$$

is the set of subderivatives of $\mathcal{S}(\theta)$ at $\theta$. Further, as illustrated in FIG. 6, for each point $$\vec{P} = \begin{bmatrix} p_1 \\ p_2 \end{bmatrix}$$

in Boundary(S) there are two associated angles. The first, $\theta$, has already been defined according to Equation (58). The second, $\varphi$, is defined as the angle formed between a vector from $\vec{o}$ to $\vec{P}$ and a vector parallel to the X-axis originating at $\vec{o}$. The relationship between $\theta$ and $\varphi$ satisfies the following subdifferential inequality:

$$\theta + \tan^{-1}\left(\frac{\min\left\{\frac{\delta S(\theta)}{\delta \theta}\right\}}{S(\theta)}\right) \leq \varphi \leq \theta + \tan^{-1}\left(\frac{\max\left\{\frac{\delta S(\theta)}{\delta \theta}\right\}}{S(\theta)}\right) \quad (63)$$

For a shape S with a continuous shape spectrum, Origin(S) $\in$Interior(S), and for which Boundary(S) contains no straight line segments, the set of subderivatives, $$\frac{\delta S(\theta)}{\delta \theta},$$

associated with each $\theta$ contains a single element $$\frac{\delta S(\theta)}{\delta \theta} = \left\{\frac{\partial S(\theta)}{\partial \theta}\right\} \quad (64)$$

and thus $$\theta = \varphi - \tan^{-1}\left(\frac{\frac{\partial S(\theta)}{\partial \theta}}{S(\theta)}\right) \quad (65)$$

$$a_1(\theta, o_1) = b_1(\theta, o_1) = S(\theta)\cos(\theta) - \sin(\theta)\frac{\partial S(\theta)}{\partial \theta} + o_1 \quad (66)$$

$$a_2(\theta, o_2) = b_2(\theta, o_2) = S(\theta)\sin(\theta) + \cos(\theta)\frac{\partial S(\theta)}{\partial \theta} + o_2 \quad (67)$$

In this case, as illustrated in FIG. 6, an analytical shape function for S, satisfying Equations (27) though (29), can be constructed as:

$$\mathbb{S}(\vec{X}, \vec{O}) = \frac{\|\vec{X} - \vec{O}\|}{\|\vec{P} - \vec{O}\|} \quad (68)$$

$$= \frac{\sqrt{(x_1 - o_1)^2 + (x_2 - o_2)^2}}{\sqrt{(p_1 - o_1)^2 + (p_2 - o_2)^2}}$$

$$= \sqrt{\frac{(x_1 - o_1)^2 + (x_2 - o_2)^2}{(p_1 - o_1)^2 + (p_2 - o_2)^2}}$$

where $$\vec{X} = \begin{bmatrix} x_1 \\ x_2 \end{bmatrix}; \vec{O} = \begin{bmatrix} o_1 \\ o_2 \end{bmatrix}; \vec{P} = \begin{bmatrix} p_1 \\ p_2 \end{bmatrix};$$

$\theta$ satisfies Equation (65) when $$\varphi = \tan^{-1}\left(\frac{x_2 - o_2}{x_1 - o_1}\right);$$

and, based on Equations (66) and (67), $p_1 = a_1(\theta, o_1)$ and $p_2 = a_2(\theta, o_2)$.

Analytical Representations of BD Constraints

We will now consider an approach to generating analytical representations for a wide variety of BD constraints. To begin with, simple BD constraints between the exterior surfaces of two shapes, $S_1$ and $S_2$, can be constructed with the use of UEBSCA, or $EB = S_1 \odot S_2$, while simple BD constraints between the exterior surface of one shape and the interior surface of another can be constructed with the use of UIBSCA, or $IB = S_1 \oslash S_2$. Further, we can break these two categories into at least three sub types: non-overlap, abutment and overlap constraints between the boundary surfaces of $S_1$ and $S_2$. One way we can generate an analytical representation for a BD constraint that can be used to determine if the exterior surfaces of $S_1$ and $S_2$ abut, Boundary($S_1$)∩Boundary($S_2$)$\neq \emptyset$ and Interior($S_1$)∩Interior($S_2$)=$\emptyset$, is by generating a shape function for EB, $\mathbb{EB}(\vec{x}, \text{Origin}(S_1))$, and checking to see if Origin($S_2$) is in Boundary(EB) using the equality constraint $$\mathbb{EB}(\text{Origin}(S_2), \text{Origin}(S_1)) = 1 \quad (69)$$

or an equivalent such as $\mathbb{EB}(\text{Origin}(S_2) - \text{Origin}(S_1), \vec{0}\ \mathbf{0}) = \mathbf{1}$, where $\vec{0}$ is a vector where all components are zero. In a similar fashion, one way we can determine that the non-overlap constraint $\overline{\text{Exterior}(S_1) \cap \text{Exterior}(S_2)} = \emptyset$ between $S_1$ and $S_2$ is satisfied, is by checking to see if Origin($S_2$) is in Exterior(EB) using $$\mathbb{EB}((\text{Origin}(S_2), \text{Origin}(S_1)) > 1 \quad (70)$$

or an equivalent. Likewise, one way we can determine that the overlap constraint Interior($S_1$)∩Interior ($S_2$)$\neq \emptyset$ between $S_1$ and $S_2$ is satisfied is by checking to see if Origin($S_2$) is in Interior (EB) using $$\mathbb{EB}(\text{Origin}(S_2), \text{Origin}(S_1)) < 1 \quad (71)$$

or an equivalent.

Extending these ideas to containment constraints between $S_1$ and $S_2$ we have $$\mathbb{IB}(\text{Origin}(S_2), \text{Origin}(S_1)) = 1 \quad (72)$$

$$\mathbb{IB}(\text{Origin}(S_2), \text{Origin}(S_1)) > 1 \quad (73)$$

$$\mathbb{IB}(\text{Origin}(S_2), \text{Origin}(S_1)) < 1 \quad (74)$$

where Equations (72) verify abutment between the interior surface of $S_1$ and the exterior surface of $S_2$, Boundary($S_1$) ∩Boundary($S_2$)$\neq \equiv$ and Interior($S_2$)$\subseteq$Interior($S_1$); Equations (73) verify the overlap constraint Exterior($S_1$)∩Interior ($S_2$)$\neq \emptyset$ between $S_1$ and $S_2$; and Equations (74) verify the containment constraint $\overline{\text{Exterior}(S_2)} \subset \text{Interior}(S_1)$ between $S_1$ in $S_2$.

Distance Spectrums

To broaden the range of BD constraints that can be checked we need to be able to determine EBSCA and IBSCA which account for nonzero distance constraints between surfaces. That is, we need to be able to determine CEBSCA and CIBSCA. One way to do this is through the use of distance spectrums.

Definition 17: A distance spectrum, $\mathcal{D}(\vec{\theta})$, is a function whose values represent the adjustments to be made in the distance values of a shape's shape spectrum. Associated with a shape spectrum and a distance spectrum are two operations, $\oplus$ and $\ominus$, where $\oplus$ "adds" a distance spectrum to a shape spectrum, and $\ominus$ "subtracts" a distance spectrum from a shape spectrum. Further, one or more values of direction $\vec{\theta}$ can have a value of $\mathcal{D}(\vec{\theta})$ which is undefined. We will refer to distance spectrums with no undefined values as explicit distance spectrums and those with one or more undefined values as implicit distance spectrums. For a shape spectrum $\mathcal{S}(\vec{\theta})$ and a distance spectrum $\mathcal{D}(\vec{\theta})$, the shape spectrums $\mathcal{S}(\vec{\alpha}) \oplus \mathcal{D}(\vec{\alpha})$ and $\mathcal{S}(\vec{\alpha}) \ominus \mathcal{D}(\vec{\alpha})$ can be determined as follows:

For all $\vec{\alpha}$ which have defined values for $\mathcal{D}(\vec{\alpha})$, $\mathcal{S}(\vec{\alpha}) \oplus \mathcal{D}(\vec{\alpha}) = \mathcal{S}(\vec{\alpha}) + \mathcal{D}(\vec{\alpha})$, and $\mathcal{S}(\vec{\alpha}) \ominus \mathcal{D}(\vec{\alpha}) = \mathcal{S}(\vec{\alpha}) - \mathcal{D}(\vec{\alpha})$.

If, for a given a, $\mathcal{D}(\vec{\alpha})$ D(a) is undefined and $\mathcal{S}(\vec{\alpha})$ is associated with a dominant PHS then $\mathcal{S}(\vec{\alpha}) \oplus \mathcal{D}(\vec{\alpha}) = \mathcal{S}(\vec{\alpha})$, and $\mathcal{S}(\vec{\alpha}) \ominus \mathcal{D}(\vec{\alpha}) = \mathcal{S}(\vec{\alpha})$.

If, for a given $\vec{\alpha}$, $\mathcal{D}(\vec{\alpha})$ is undefined and $\mathcal{S}(\vec{\alpha})$ is associated with a non-dominant PHS then the values of $\mathcal{S}(\vec{\alpha}) \oplus \mathcal{D}(\vec{\alpha})$, and $\mathcal{S}(\vec{\alpha}) \ominus \mathcal{D}(\vec{\alpha})$ are selected such that the PHS associated with $\mathcal{S}_A(\vec{\alpha})$ is also non-dominant.

One way to determine CEBSCA of two shapes, $S_1$ and $S_2$, with additional distance constraints captured as distance spectrums, $\mathcal{D}_1(\vec{\theta})$ and $\mathcal{D}_2(\vec{\theta})$, would be as follows $$EB = \mathcal{T}^{-1}(\mathcal{T}(S_1) \oplus \mathcal{D}_1(\vec{\theta}), Origin(S_1)) \odot \mathcal{T}^{-1}(\mathcal{T}(S_2 \oplus \mathcal{D}_2(\vec{\theta}), Origin(S_2)) \quad (75)$$

when both operands of the $\odot$ operation are convex shapes. From this we can determine the shape spectrum, $\varepsilon\mathcal{B}(\vec{\theta})$, of EB as $$\varepsilon\mathcal{B}(\vec{\theta}) = \mathcal{S}_1(\vec{\theta}) \oplus \mathcal{D}_1(\vec{\theta}) + \mathcal{S}_2(\vec{\theta} + \overline{180}) \oplus \mathcal{D}_2(\vec{\theta} + \overline{180}) \quad (76)$$

When $\mathcal{D}_1(\vec{\theta})$ and $\mathcal{D}_2(\vec{\theta})$ are both explicit distance spectrums Equation (76) reduces to $$\varepsilon\mathcal{B}(\vec{\theta}) = \mathcal{S}_1(\vec{\theta}) + \mathcal{D}_1(\vec{\theta}) + \mathcal{S}_2(\vec{\theta} + \overline{180}) + \mathcal{D}_2(\vec{\theta} + \overline{180}) \quad (77)$$

$$= \mathcal{S}_1(\vec{\theta}) + \mathcal{S}_2(\vec{\theta} + \overline{180}) + \mathcal{D}_3(\vec{\theta})$$

where $\mathcal{D}_3(\vec{\theta}) = \mathcal{D}_1(\vec{\theta}) + \mathcal{D}_2(\vec{\theta} + \overline{180})$.

More generally, for the case where one or both of shapes $S_1$ and $S_2$ are non-convex we can represent the non-convex shape as the union of a set of convex shapes. Specifically, when both of shapes $S_1$ and $S_2$ are non-convex we assume that $S_1 = \bigcup_{i=1,m} S_{1,i}$ and $S_2 = \bigcup_{j=1,n} S_{2,j}$, where $S_{1,1}, \ldots S_{1,m}$ and $S_{2,1}, \ldots S_{2,n}$ are all convex shapes and $\text{Origin}(S_2) = \text{Origin}(S_{2,1}) = \ldots = \text{Origin}(S_{2,n})$. Applying Equations (21) and (75) we can incorporate distance spectrums $\mathcal{D}_{1,1}(\vec{\theta}), \ldots \mathcal{D}_{1,m}(\vec{\theta})$ and $\mathcal{D}_{2,1}(\vec{\theta}), \ldots \mathcal{D}_{2,n}(\vec{\theta})$ into the determination of the CEBSCA of $S_1$ and $S_2$ as $$EB = \bigcup_{\substack{i=1,m \\ j=1,n}} \left( \begin{array}{c} \mathcal{T}^{-1}(\mathcal{T}(S_{1,i}) \oplus \mathcal{D}_{1,i}(\vec{\theta}), Origin(S_{1,i})) \odot \\ \mathcal{T}^{-1}(\mathcal{T}(S_{2,j}) \oplus \mathcal{D}_{2,j}(\vec{\theta}), Origin(S_{2,j})) \end{array} \right) \quad (78)$$

when both operands of each $\odot$ operation are convex shapes.

From this, it can be seen that complex BD constraints between the exterior surfaces of two shapes can be constructed, in a form similar to one of Equations (69) through (71), with the use of UEBSCA in combination with one or more distance spectrums.

We will now look at one way to use distance spectrums in combination with UIBSCA to form CIBSCA. Specifically, given two shapes, $S_1 = \bigcup_{i=1,m} S_{1,i}$ and $S_2 = \bigcup_{j=1,n} S_{2,j}$, and two sets of distance spectrums, $\mathcal{D}_{1,1}(\vec{\theta}), \ldots \mathcal{D}_{1,m}(\vec{\theta})$ and $\mathcal{D}_{2,1}(\vec{\theta}), \ldots \mathcal{D}_{2,n}(\vec{\theta})$ where $S_{1,1}, \ldots S_{1,m}$ and $S_{2,1}, \ldots S_{2,n}$ are all convex shapes and $\text{Origin}(S_2) = \text{Origin}(S_{2,1}) = \ldots = \text{Origin}(S_{2,n})$, we would like to determine the CIBSCA between the interior surface of $S_1$ and the exterior surface of $S_2$. To do this we will again rely on Equation (26) to transform an IBSCA problem into an EBSCA problem. To do this we begin by applying $\mathcal{D}_{1,1}(\vec{\theta}), \ldots \mathcal{D}_{1,m}(\vec{\theta})$ to $S_1 = \bigcup_{i=1,m} S_{1,i}$ $$S_1' = \bigcup_{i=1,m} \mathcal{T}^{-1}(\mathcal{T}(S_{1,i}) \ominus \mathcal{D}_{1,i}(\vec{\theta}), Origin(S_{1,i})) \quad (79)$$

then we invert $S_1'$ and decompose the resulting shape into a union of convex shapes $$\overline{S_1'} = S_3 = \bigcup_{k=1,q} S_{3,k} \quad (80)$$

Using this new set of convex shapes, $S_{3,1}, \ldots S_{3,q}$ we can form the CIBSCA of $S_1$ and $S_2$ as $$IB = S_1 \odot S_2 = \bigcup_{\substack{k=1,q \\ j=1,n}} \left( S_{3,k} \odot \mathcal{T}^{-1}(\mathcal{T}(S_{2,j}) \oplus \mathcal{D}_{2,j}(\vec{\theta}), Origin(S_{2,j})) \right) \quad (81)$$

From this, complex BD constraints between the interior surface of one shape and the exterior surface of another can be constructed, in a form similar to one of Equations (72) through (74), with the use of IBSCA in combination with one or more distance spectrums.

Parameterized and Trivial Spectrums

To this point, for the sake of simplicity and clarity, we have focused on "simple spectrums". That is, shape spectrums and distance spectrums where NO additional parameters are used in the determination of the value returned by the function representing the shape spectrum or distance spectrum for a given direction. We can significantly increase the range of BD constraints that can be represented through the use of shape and distance spectrums with additional parameters, or "parameterized spectrums". That is, spectrums where additional parameters are used in the determination of the value returned by the function for a given direction. The expanded range of constraints includes, for example, constraints that can also control the size, orientation, or geometry of a shape.

We will refer to any shape or distance spectrum that produces values that are independent of the direction of interest as a "trivial" spectrum. Example of trivial shape spectrums include the simple shape spectrum of the unit circle with its origin located at the center of the circle: $\mathcal{S}(\theta) = 1$, and the parameterized shape spectrum of a sphere of radius r whose origin is located at the center of the sphere:

$$\mathcal{S}\left( \begin{bmatrix} \theta_1 \\ \theta_2 \end{bmatrix}, r \right) = r.$$

Axis Aligned Orthotopes

The above development can be significantly simplified for the case where we want to generate an EBSCA or IBSCA for a pair of n-dimensional axis-aligned (AA) orthotopes, whose origins are at the center of their respective shapes, subject to AA orthotopic boundary distance constraints. To do this we take advantage of the following two observations: first, the EBSCA and IBSCA of a pair of AA orthotopes subject to AA orthotopic boundary distance constraints are themselves n-dimensional AA orthotopes; second, the shape of an n-dimensional AA orthotope can be analytically represented using an n-dimensional superellipsoid.

Figure 7A:
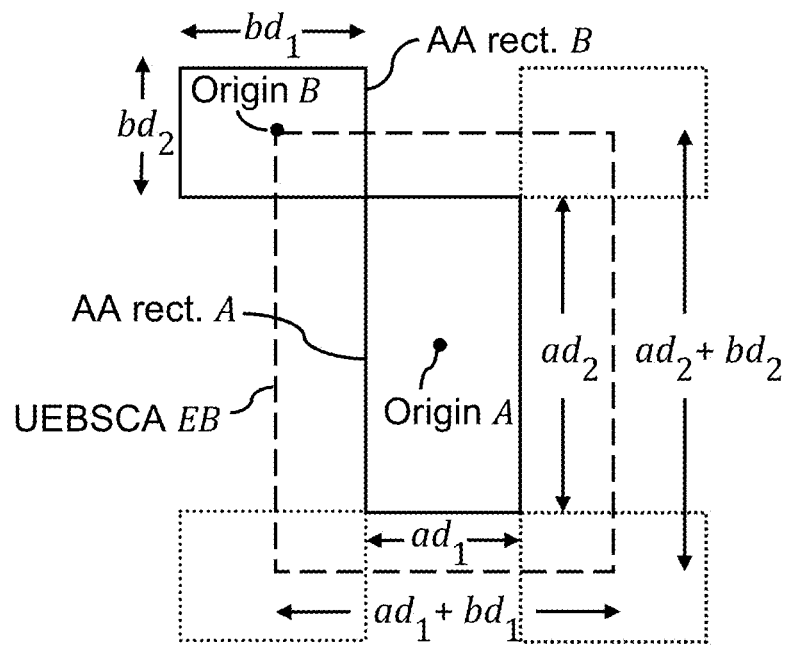
FIG. 7A-7B illustrate the geometric construction of the exterior boundary surface of closest approach between two axis aligned rectangles.

For the sake of clarity and brevity and without loss of generality, we will assume that for an n-dimensional AA orthotope, A, there is an n-dimensional vector, $\overrightarrow{AD} = [ad_1, \ldots ad_n]^T$, which contains the dimensions of A as measured along each of the coordinate axes between parallel pairs of faces. One skilled in the art will recognize that the dimensions of all AA orthotopes can be reduced to this form. Taking advantage of the first observation, we see that given two AA orthotopes, A and B, with origins $\overrightarrow{AO}$ and $\overrightarrow{BO}$ respectively, the dimensions of their UEBSCA, EB, are:

$$\overrightarrow{EBD} = \overrightarrow{AD} + \overrightarrow{BD} \qquad (82)$$

as illustrated in FIG. 7A for the two-dimensional case.

Based on the second observation, consider the case of an n-dimensional AA orthotope, C, centered at the origin of the Cartesian coordinates system with dimensions $\overrightarrow{CD} = [cd_1, \ldots cd_n]^T$. The boundary of C can be analytically represented, using an n-dimensional superellipsoid, as $$\lim_{Z_1,\ldots Z_n \to \infty} \left( \sum_{i=1}^{n} \left| 2 \frac{x_i}{ad_i} \right|^{Z_i} \right) = 1 \qquad (83)$$

If we now offset C a distance $\overrightarrow{OD} = [od_1, \ldots od_n]^T$, its boundary can be analytically represented as $$\lim_{Z_1,\ldots Z_n \to \infty} \left( \sum_{i=1}^{n} \left| 2 \frac{x_i - od_i}{cd_i} \right|^{Z_i} \right) = 1 \qquad (84)$$

Combining Equations (82) and (84) with $\overrightarrow{OD} = \overrightarrow{AO}$, the boundary of the orthotope EB can be analytically represented as $$\lim_{Z_1,\ldots Z_n \to \infty} \left( \sum_{i=1}^{n} \left| 2 \frac{x_i - ao_i}{ad_i + bd_i} \right|^{Z_i} \right) = 1 \qquad (85)$$

or, in terms of a shape function for EB, $$\mathbb{EB}(\overrightarrow{X}, \overrightarrow{O}) = \lim_{Z_1,\ldots Z_n \to \infty} \left( \sum_{i=1}^{n} \left| 2 \frac{x_i - o_i}{ad_i + bd_i} \right|^{Z_i} \right) \qquad (86)$$

Figure 7B:
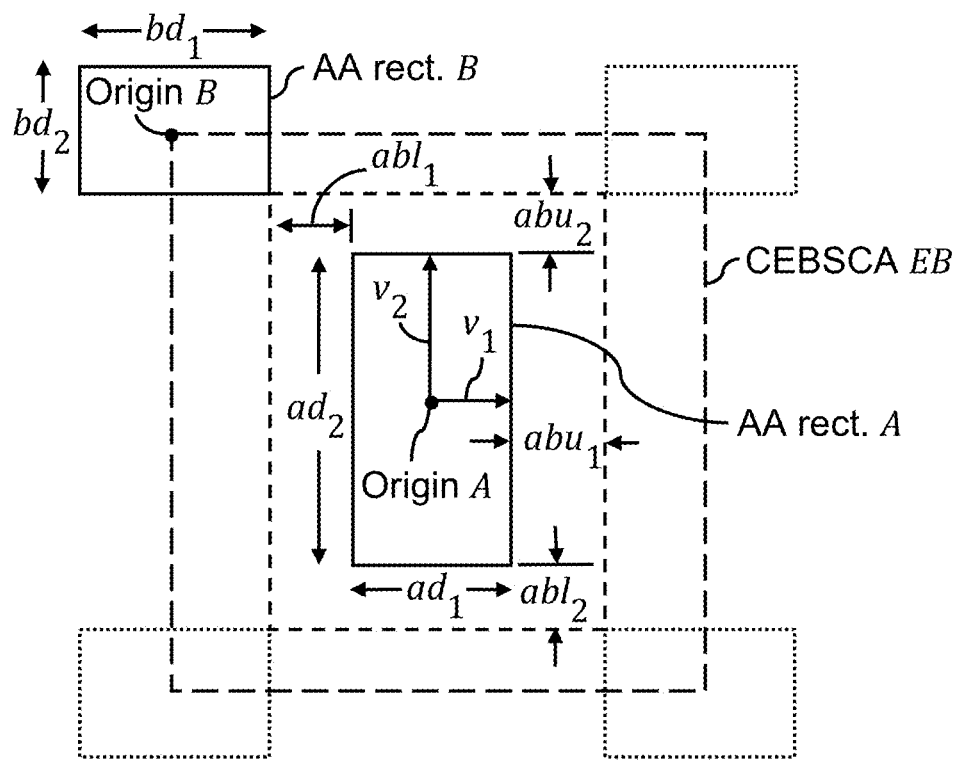

Again, for the sake of clarity and brevity and without loss of generality, we will assume that for a pair of n-dimensional AA orthotopes, A and B, there is a pair of n-dimensional vectors $\overrightarrow{ABU}$ and $\overrightarrow{ABL}$ where $\overrightarrow{ABU}$ contains the separation distances to be maintained between the "upper faces" of A and the adjacent faces of B and $\overrightarrow{ABL}$ contains the separation distances to be maintained between the "lower faces" of A and the adjacent faces of B. We define an upper face of A to be a face which intersects a vector, v, extending from $\overrightarrow{AO}$ parallel to one of the axes such that v points in the direction of increasing values along that axis, as illustrated in FIG. 7B for vectors $v_1$ and $v_2$. We define a lower face of A to be a face that is not an upper face. One skilled in the art will recognize that all AA orthotopic boundary distance constraints between AA orthotopes can be reduced to this form. We can generalize the analytical representation of the UEBSCA developed above to include upper and lower separation distances between A and B. This can be done by observing that the separation distances in effect adjust the origin and dimensions of A. That is, the origin of A is now effectively $$\overrightarrow{AO} + \frac{\overrightarrow{ABU} - \overrightarrow{ABL}}{2}$$

and the dimensions of A are now effectively $\overrightarrow{AD} + \overrightarrow{ABL} + \overrightarrow{ABU}$, as illustrated in FIG. 7B for the two-dimensional case. The resulting analytical representation of the CEBSCA, EB, which accounts for separation distances between A and B is $$\lim_{Z_1,\ldots Z_n \to \infty} \left( \sum_{i=1}^{n} \left| 2 \frac{x_i - \left(ao_i + \frac{abu_i - abl_i}{2}\right)}{ad_i + abu_i + abl_i + bd_i} \right|^{Z_i} \right) = 1 \qquad (87)$$

or, in terms of a shape function for EB, $$\mathbb{EB}(\overrightarrow{X}, \overrightarrow{O}) = \lim_{Z_1,\ldots Z_n \to \infty} \left( \sum_{i=1}^{n} \left| 2 \frac{x_i - \left(o_i + \frac{abu_i - abl_i}{2}\right)}{ad_i + abu_i + abl_i + bd_i} \right|^{Z_i} \right) \qquad (88)$$

Figure 8A:
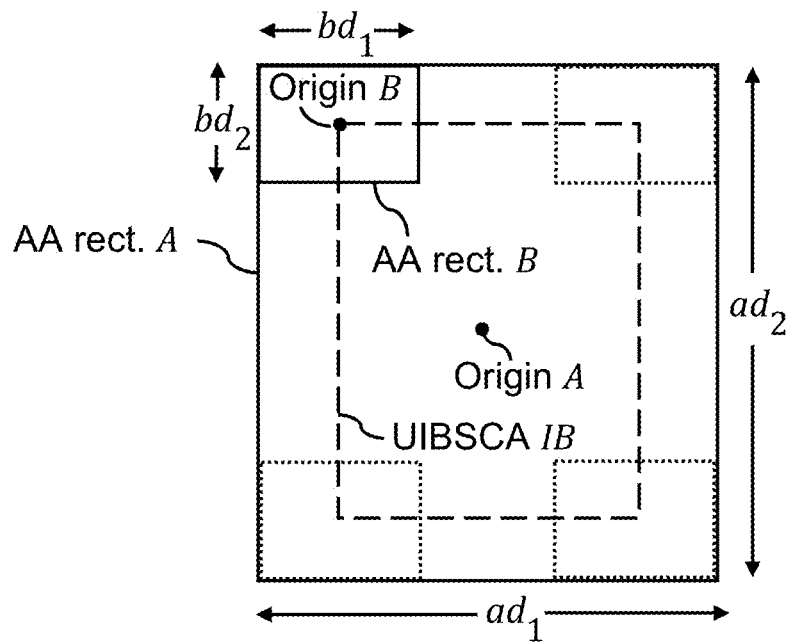
FIG. 8A-8B illustrate the geometric construction of the interior boundary surface of closest approach between two axis aligned rectangles.

In a similar manner, given two AA orthotopes, A and B, with origins $\overrightarrow{AO}$ and $\overrightarrow{BO}$ respectively, the dimensions of their UIBSCA, IB, are:

$$\overrightarrow{IBD} = \overrightarrow{AD} - \overrightarrow{BD} \qquad (89)$$

as illustrated in FIG. 8A for the two-dimensional case.

Combining Equations (84) and (89) with $\overrightarrow{OD} = \overrightarrow{AO}$, the boundary of the orthotope IB can be analytically represented as $$\lim_{Z_1,\ldots Z_n \to \infty} \left( \sum_{i=1}^{n} \left| 2 \frac{x_i - ao_i}{ad_i - bd_i} \right|^{Z_i} \right) = 1 \qquad (90)$$

or, in terms of a shape function for IB, $$\mathbb{IB}(\overrightarrow{X}, \overrightarrow{O}) = \lim_{Z_1,\ldots Z_n \to \infty} \left( \sum_{i=1}^{n} \left| 2 \frac{x_i - o_i}{ad_i - bd_i} \right|^{Z_i} \right) \qquad (91)$$

Figure 8B:
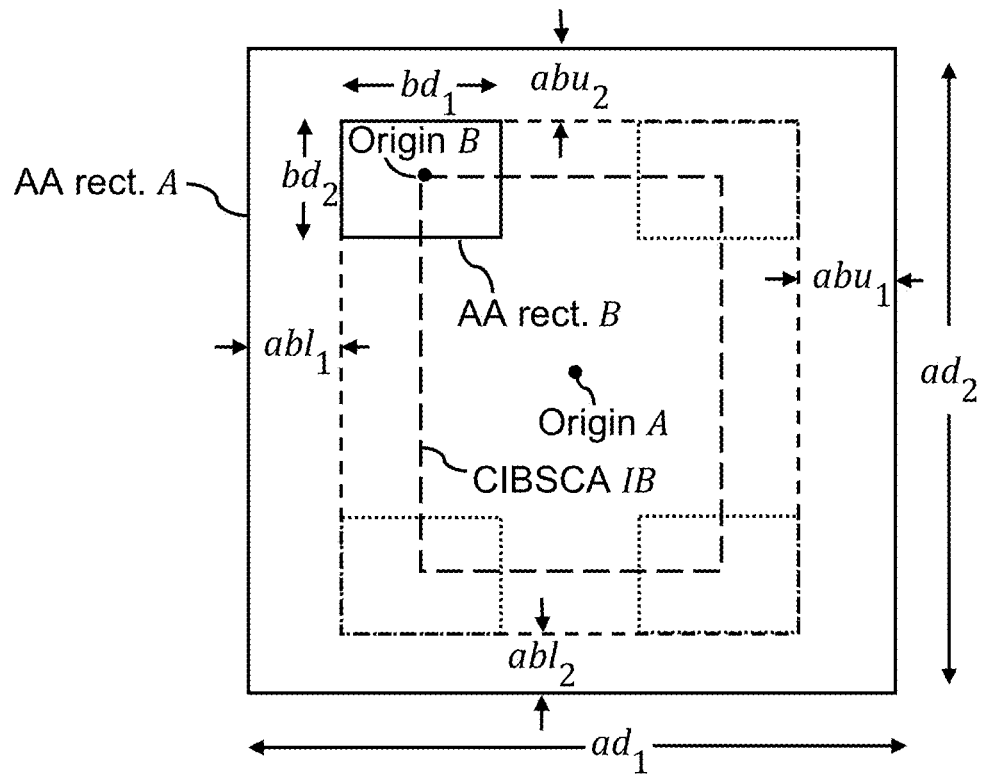

Again, we can generalize the analytical representation of the IBSCA developed above to include upper and lower separation distances between A and B by observing that the separation distances in effect adjust the origin and dimensions of A. That is, the origin of A is now effectively $$\overrightarrow{AO} + \frac{\overrightarrow{ABL} - \overrightarrow{ABU}}{2}$$

and its dimensions are now effectively $\overline{AD} - \overline{ABL} - \overline{ABU}$, as illustrated in FIG. 8B for the two-dimensional case. The resulting analytical representation of the CIBSCA, IB, which accounts for separation distances between A and B is $$\lim_{Z_1,\ldots Z_n \to \infty} \left( \sum_{i=1}^{n} \left| 2 \frac{x_i - \left(ao_i + \frac{abl_i - abu_i}{2}\right)}{ad_i - abu_i - abl_i - bd_i} \right|^{Z_i} \right) = 1 \quad (92)$$

or, in terms of a shape function for IB, $$\mathbb{IB}(\overline{X}, \overline{O}) = \lim_{Z_1,\ldots Z_n \to \infty} \left( \sum_{i=1}^{n} \left| 2 \frac{x_i - \left(o_i + \frac{abl_i - abu_i}{2}\right)}{ad_i - abu_i - abl_i - bd_i} \right|^{Z_i} \right) \quad (93)$$

Note that, as we would expect, Equations (86), (88), (91), and (93) are in the form of Equation (56) with q=n and p=0.

Direct Application of Analytical Composition

Figure 9A:
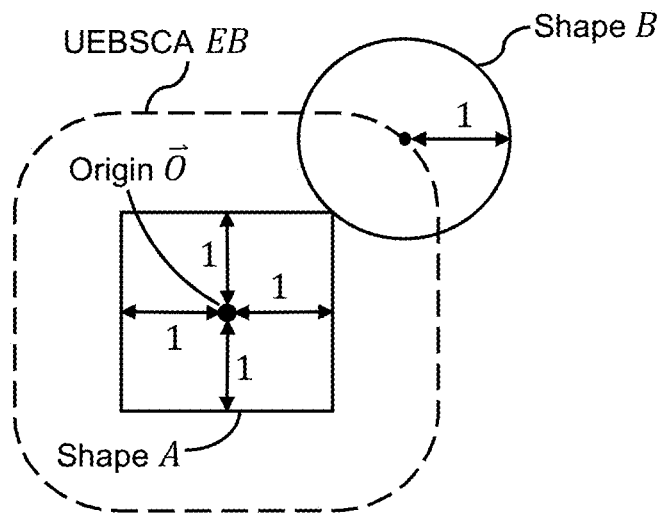
FIG. 9A-9B illustrate a method for determining an analytical shape function for the unconstrained exterior boundary surface of closest approach between a square and a circle using geometric construction and analytical union.
Figure 9B:
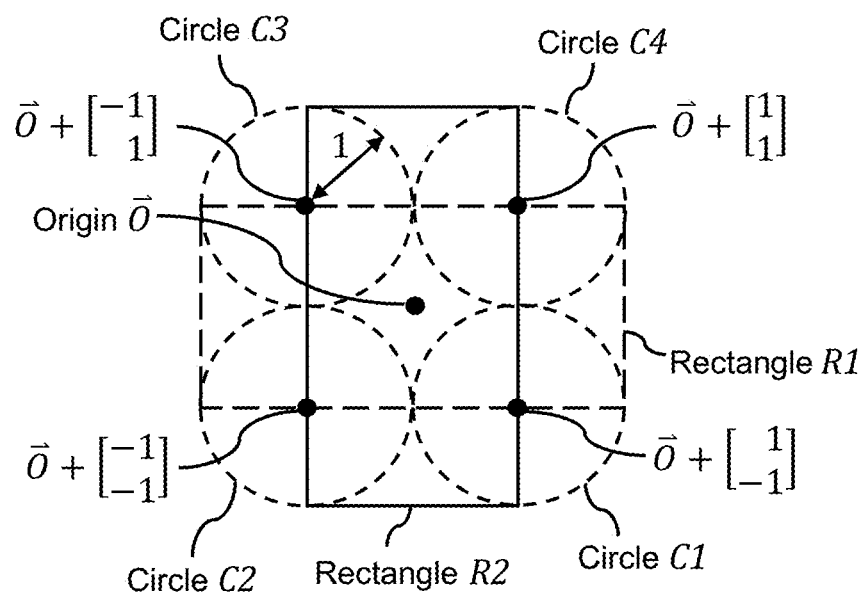

In cases where BSCAs can be deduced through inspection or simple geometric constructions and an analytical shape functions for the shapes involved are known, then analytical composition can be directly applied to construct an analytical shape function for the required BSCA. That is, we can apply analytical intersections, inversions and unions directly to the shape functions to construct an analytical shape function for the required BSCA. As an example of this approach consider the case illustrated in FIG. 9. In this case, as illustrated in FIG. 9A, we are interested in constructing the UEBSCA, EB, between a square, shape A, and a circle, shape B, where the square is two units wide by two units tall with its origin at its center and the circle has radius one with its origin at its center. From FIG. 9B we can see that EB=A⊙B can be determined as the union of six shapes: two overlapping rectangles, R1 and R2, and four circles, C1, C2, C3, and C4. The shape functions for the four circles can be represented as $$\mathbb{C}1(\overline{X}, \overline{O}) = \mathbb{C}1\left(\begin{bmatrix} x_1 \\ x_2 \end{bmatrix}, \begin{bmatrix} o_1 \\ o_2 \end{bmatrix}\right) = (x_1 - o_1 - 1)^2 + (x_2 - o_2 + 1)^2 \quad (94)$$

$$\mathbb{C}2(\overline{X}, \overline{O}) = \mathbb{C}2\left(\begin{bmatrix} x_1 \\ x_2 \end{bmatrix}, \begin{bmatrix} o_1 \\ o_2 \end{bmatrix}\right) = (x_1 - o_1 + 1)^2 + (x_2 - o_2 + 1)^2 \quad (95)$$

$$\mathbb{C}3(\overline{X}, \overline{O}) = \mathbb{C}3\left(\begin{bmatrix} x_1 \\ x_2 \end{bmatrix}, \begin{bmatrix} o_1 \\ o_2 \end{bmatrix}\right) = (x_1 - o_1 + 1)^2 + (x_2 - o_2 - 1)^2 \quad (96)$$

$$\mathbb{C}4(\overline{X}, \overline{O}) = \mathbb{C}4\left(\begin{bmatrix} x_1 \\ x_2 \end{bmatrix}, \begin{bmatrix} o_1 \\ o_2 \end{bmatrix}\right) = (x_1 - o_1 - 1)^2 + (x_2 - o_2 - 1)^2 \quad (97)$$

and, using superellipses, the two rectangles can be represented as $$\mathbb{R}1(\overline{X}, \overline{O}) = \mathbb{R}1\left(\begin{bmatrix} x_1 \\ x_2 \end{bmatrix}, \begin{bmatrix} o_1 \\ o_2 \end{bmatrix}\right) = \lim_{Z \to \infty} \left( \left|\frac{x_1 - o_1}{2}\right|^Z + |x_2 - o_2|^Z \right) \quad (98)$$

$$\mathbb{R}2(\overline{X}, \overline{O}) = \mathbb{R}2\left(\begin{bmatrix} x_1 \\ x_2 \end{bmatrix}, \begin{bmatrix} o_1 \\ o_2 \end{bmatrix}\right) = \lim_{Z \to \infty} \left( |x_1 - o_1|^Z + \left|\frac{x_2 - o_2}{2}\right|^Z \right) \quad (99)$$

Using an analytical union, we can construct an analytical shape function for EB=A⊙B as $$\mathbb{EB}(\overline{X}, \overline{O}) = \lim_{R \to \infty} \left( \frac{\mathbb{C}1(\overline{X}, \overline{O})^{-R} + \mathbb{C}2(\overline{X}, \overline{O})^{-R} + \mathbb{C}3(\overline{X}, \overline{O})^{-R} +}{\mathbb{C}4(\overline{X}, \overline{O})^{-R} + \mathbb{R}1(\overline{X}, \overline{O})^{-1} + \mathbb{R}2(\overline{X}, \overline{O})^{-1}} \right)^{-1} \quad (100)$$

Methods

Figure 10:
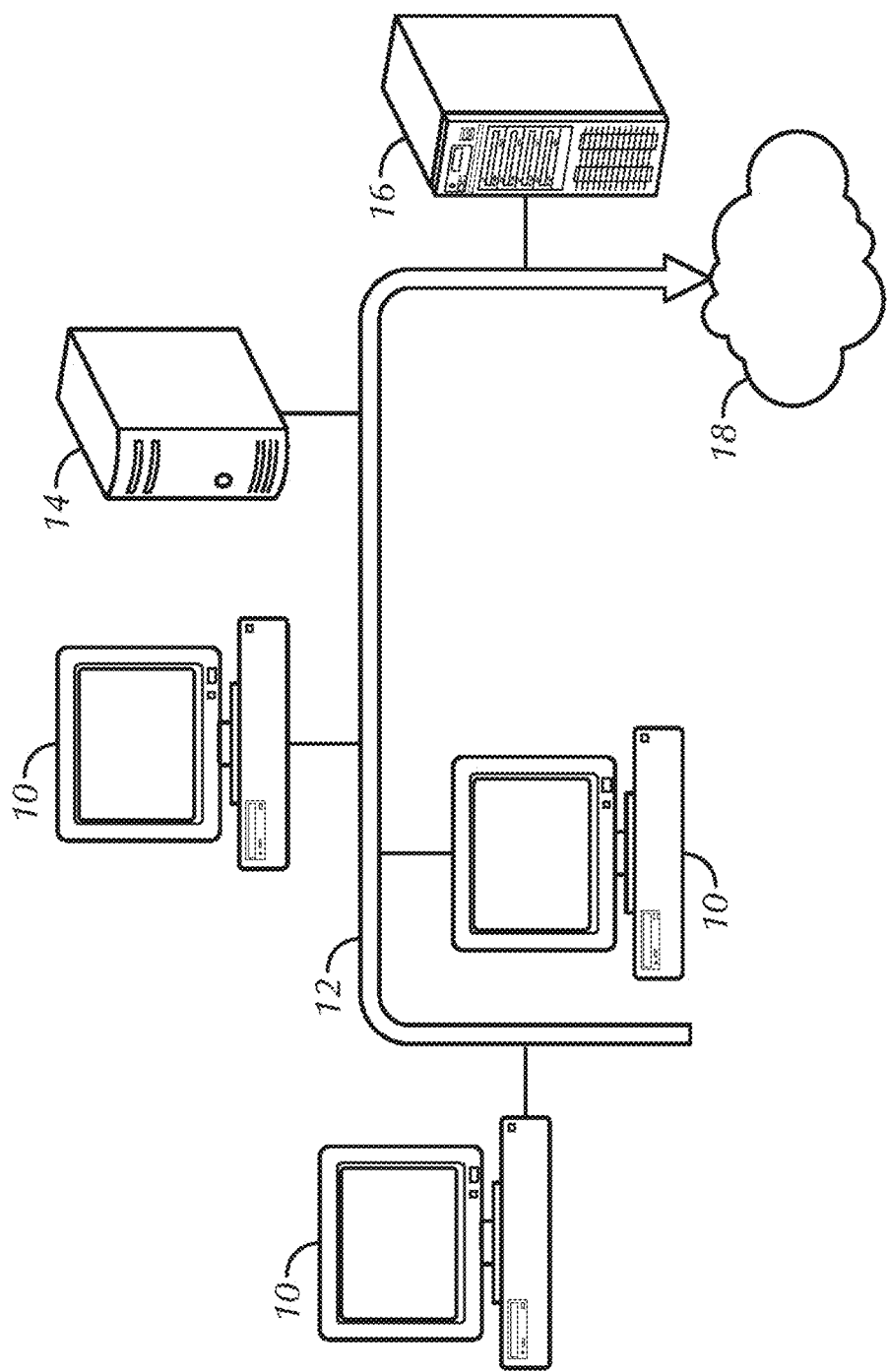
FIG. 10 illustrates a typical networked computer environment in which the invention would operate.

FIG. 10 illustrates the use of the present invention in a typical networked environment. The claimed invention is a software program that runs on one or more workstations 10 that may be in a networked environment. The various workstations 10 couple to a network 12 where they may communicate with each other. Additionally, the networked environment may include a shared storage device 14 and a network server 16. And, the networked environment may couple to the Internet 18. In addition to being able to operate on one or more workstations 10, the invention may use the resources of the shared storage device 14 and the network server 16. The invention may also use resources available through the Internet 18. One embodiment of the invention uses a LINUX based standalone workstation 10 and uses the FORTRAN programming language. One skilled in the arts will appreciate the invention can be implemented using other programming languages and that it may be hosted on other operating systems.

Figure 11A:
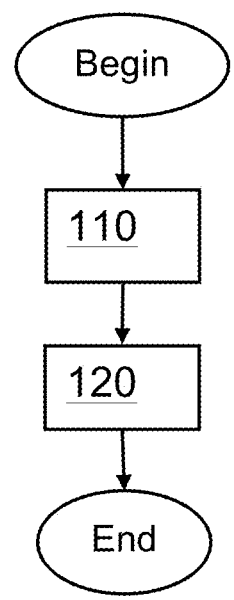
FIG. 11A-11B illustrate two embodiments of a method for determining if arrangement of two shapes satisfy an exact or approximate analytical function representation of a boundary distance constraint between those shapes.

FIG. 11A illustrates a first embodiment of a method for determining if an arrangement of two shapes satisfies an exact or approximate analytical function representation of a boundary distance constraint between those shapes. This embodiment includes constructing 110 a function which is an exact or approximate analytical representation of the constraint between two shapes using one or more of the following: (1) one or more external boundary surface of closest approach where at least one of the external boundary surfaces of closest approach is not an n-sphere and each external boundary surface of closest approach is formed from two shapes and, optionally, additional boundary distance constraints between the shapes and is determined using the addition of two or three functions where one of the three functions represents the first shape and another function represents the second shape and, optionally, a third function represents the additional boundary distance constraints between the shapes; (2) one or more analytical compositions or; (3) one or more superellipsoid shape function approximations for the interior or exterior boundary surface of closest approach between a pair of axis aligned orthotopes with axis-aligned orthotopic boundary distance constraints. Further, this embodiment includes evaluating 120 the function constructed in 110 to determine if the constraint between the two shapes is exactly or approximately satisfied.

Figure 11B:
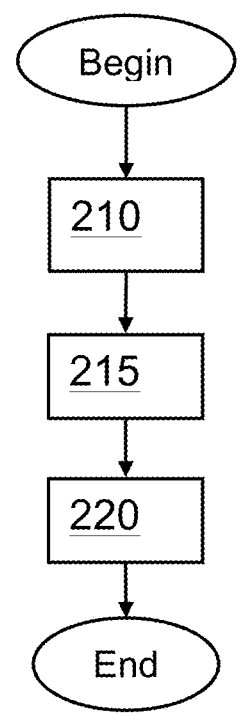

FIG. 11B illustrates a second embodiment of a method for determining if an arrangement of two shapes satisfies an exact or approximate analytical function representation of a boundary distance constraint between those shapes. This embodiment includes constructing 210 a function which is an exact or approximate analytical representation of the constraint between two shapes using one or more of the following: (1) one or more external boundary surface of closest approach where at least one of the external boundary surfaces of closest approach is not an n-sphere and each external boundary surface of closest approach is formed from two shapes and, optionally, additional boundary distance constraints between the shapes and is determined using the addition of two or three functions where one of the three functions represents the first shape and another function represents the second shape and, optionally, a third function represents the additional boundary distance constraints between the shapes; (2) one or more analytical compositions or; (3) one or more superellipsoid shape function approximations for the interior or exterior boundary surface of closest approach between a pair of axis aligned orthotopes with axis-aligned orthotopic boundary distance constraints. In addition, this embodiment includes assigning 215 values to variables and/or parameters of the function constructed in 210. Further, this embodiment includes evaluating 220 the function constructed in 210 using the assignments of 215 to determine if the constraint between the two shapes is exactly or approximately satisfied.

EXAMPLES

To illustrate the use of these methods we will, without loss of generality, consider three examples. The first two will demonstrate their use on shapes represented using DR shape spectrums and the second will demonstrate their use on shapes represented using shape spectrums.

Example 1

Figure 12:
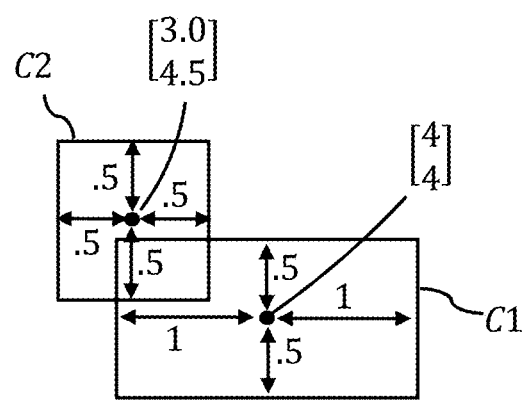
FIG. 12 illustrates the location of two circuit blocks and the discrete representation of their shape spectrums.

This example will illustrate the use of the method outlined in the flow chart of FIG. 11A. This example illustrates one application of this method in the manufacture of VLSI circuits and is based on the illustration in FIG. 12. In this example, as shown in FIG. 12, we have two circuit blocks, labeled C1 and C2, along with their DR shape spectrums and origins. We want to check to see that the circuit blocks satisfy a non-overlap boundary distance constraint that requires a minimum spacing of one tenth (0.1) of a unit between the adjacent sides of the circuit blocks. From FIG. 12 we have that:

C1 is two units wide and one unit tall with its origin initially located at $$\begin{bmatrix} 4 \\ 4 \end{bmatrix}$$

and a DR shape spectrum:

$$C1(\theta) = \begin{cases} 1.0 & \theta = 0° \\ 0.5 & \theta = 90° \\ 1.0 & \theta = 180° \\ 0.5 & \theta = 270° \end{cases} \tag{101}$$

C2 is one unit wide and one unit tall with its origin initially located at $$\begin{bmatrix} 3.0 \\ 4.5 \end{bmatrix}$$

and a DR shape spectrum:

$$C2(\theta) = \begin{cases} 0.5 & \theta = 0° \\ 0.5 & \theta = 90° \\ 0.5 & \theta = 180° \\ 0.5 & \theta = 270° \end{cases} \tag{102}$$

From the geometry of each circuit block and the minimum spacing requirement, one set of implicit distance spectrums that captures the minimum spacing requirements between the circuit blocks is $$\mathcal{D}_{C1}(\theta) = \mathcal{D}_{C2}(\theta) = \begin{cases} 0.05 & \theta = 0° \\ 0.05 & \theta = 90° \\ 0.05 & \theta = 180° \\ 0.05 & \theta = 270° \end{cases} \tag{103}$$

Based on the flow chart of FIG. 11A, step 110 can generate an approximate analytical function representation of the boundary distance constraint between C1 and C2 as follows: We begin by applying the distance spectrums to the shape spectrums for C1 and C2 as:

$$C1_D(\theta) = C1(\theta) \oplus \mathcal{D}_{C1}(\theta) \tag{104}$$

$$C2_D(\theta) = C2(\theta) \oplus \mathcal{D}_{C2}(\theta) \tag{105}$$

We can then determine the DR shape spectrum for the EBSCA for C1 and C2, accounting for distance spectrums $\mathcal{D}_{C1}(\theta)$ and $\mathcal{D}_{C2}(\theta)$, as:

$$\mathcal{EB}(\theta) = C1_D(\theta) + C2_D(\theta) = \begin{cases} 1.6 & \theta = 0° \\ 1.1 & \theta = 90° \\ 1.6 & \theta = 180° \\ 1.1 & \theta = 270° \end{cases} \tag{106}$$

We can then generate affine functions for the DR shape spectrum of Equation (106). Since the spectrum is symmetric, we only need to generate two affine functions whose coefficients are:

$$\vec{K}_{0°} = \frac{2}{\mathcal{EB}(0° + 180°) + \mathcal{EB}(0°)} \begin{bmatrix} \cos(0°) \\ \sin(0°) \end{bmatrix} = \frac{2}{3.2}\begin{bmatrix} 1 \\ 0 \end{bmatrix} \tag{107}$$

$$K_{0°} = -\vec{K}_{0°}^T \begin{bmatrix} 4.0 \\ 4.0 \end{bmatrix} + \frac{\mathcal{EB}(0° + 180°) - \mathcal{EB}(0°)}{\mathcal{EB}(0° + 180°) + \mathcal{EB}(0°)} = -\frac{2}{3.2}4.0$$

$$\vec{K}_{90°} = \frac{2}{\mathcal{EB}(90° + 180°) + \mathcal{EB}(90°)} \begin{bmatrix} \cos(90°) \\ \sin(90°) \end{bmatrix} = \frac{2}{2.2}\begin{bmatrix} 0 \\ 1 \end{bmatrix} \tag{108}$$

$$K_{90°} = -\vec{K}_{90°}^T \begin{bmatrix} 4.0 \\ 4.0 \end{bmatrix} + \frac{\mathcal{EB}(90° + 180°) - \mathcal{EB}(90°)}{\mathcal{EB}(90° + 180°) + \mathcal{EB}(90°)} = -\frac{2}{2.2}4.0$$

We can then generate shape functions for these affine functions as $$Q_{0°}\left(\begin{bmatrix} x \\ y \end{bmatrix}, \begin{bmatrix} 4.0 \\ 4.0 \end{bmatrix}\right) = \left|\vec{K}_{0°}^T \begin{bmatrix} x \\ y \end{bmatrix} + K_{0°}\right| = \left|\frac{2(x - 4.0)}{3.2}\right| \tag{109}$$

$$Q_{90°}\left(\begin{bmatrix} x \\ y \end{bmatrix}, \begin{bmatrix} 4.0 \\ 4.0 \end{bmatrix}\right) = \left|\vec{K}_{90°}^T \begin{bmatrix} x \\ y \end{bmatrix} + K_{90°}\right| = \left|\frac{2(y - 4.0)}{2.2}\right| \tag{110}$$

followed by an analytical intersection to form the shape function $$S\left(\begin{bmatrix} 3.0 \\ 4.5 \end{bmatrix}, \begin{bmatrix} 4.0 \\ 4.0 \end{bmatrix}\right) = \quad (111)$$

$$\lim_{Z \to \infty} \left(Q_{0°}\left(\begin{bmatrix} 3.0 \\ 4.5 \end{bmatrix}, \begin{bmatrix} 4.0 \\ 4.0 \end{bmatrix}\right)^Z + Q_{90°}\left(\begin{bmatrix} 3.0 \\ 4.5 \end{bmatrix}, \begin{bmatrix} 4.0 \\ 4.0 \end{bmatrix}\right)^Z\right) =$$

$$\lim_{Z \to \infty} \left(\left|\frac{2(3.0 - 4.0)}{3.2}\right|^Z + \left|\frac{2(4.5 - 4.0)}{2.2}\right|^Z\right)$$

Based on Equation (111), and using a value of Z=3000 we can generate an analytical approximation of the non-overlap constraint function between C1 and C2 as $$\left|\frac{2(3.0 - 4.0)}{3.2}\right|^{3000} + \left|\frac{2(4.5 - 4.0)}{2.2}\right|^{3000} > 1 \quad (112)$$

In step 120 evaluate Equation (112) to determine that the boundary distance constraint between C1 and C2 is not satisfied.

Example 2

In this example, we will again look at the problem outlined in Example 1. In this case however we will take advantage of the fact that shapes C1 and C2 are axis aligned rectangles subject to orthotopic boundary distance constraints. As such, we can use superellipsoid shape function approximations to generate an analytical approximation function for the BD constraint.

From FIG. 12 we can see that the dimension vectors associated with shapes C1, and C2 are $$\overrightarrow{C1D} = [2,1]^T \quad (113)$$

$$\overrightarrow{C2D} = [1,1]^T \quad (114)$$

Additionally, we know that the upper and lower separation distance vectors between C1 and C2 are $$\overrightarrow{C1C2U} = [0.1, 0.1]^T \quad (115)$$

$$\overrightarrow{C1C2L} = [0.1, 0.1]^T \quad (116)$$

With this information and using Equation (88) we can generate the shape function for the EBSCA between C1 and C2 as $$EB\left(\begin{bmatrix} 3.0 \\ 4.5 \end{bmatrix}, \begin{bmatrix} 4.0 \\ 4.0 \end{bmatrix}\right) = \quad (117)$$

$$\lim_{Z \to \infty} \left(\left|2\frac{3.0 - \left(4.0 + \frac{0.1 - 0.1}{2}\right)}{2 + 0.1 + 0.1 + 1}\right|^Z + \left|2\frac{4.5 - \left(4.0 + \frac{0.1 - 0.1}{2}\right)}{2 + 0.1 + 0.1 + 1}\right|^Z\right) =$$

$$\lim_{Z \to \infty} \left(\left|2\frac{3.0 - 4.0}{3.2}\right|^Z + \left|2\frac{4.5 - 4.0}{2.2}\right|^Z\right)$$

Based on Equation (117) and using a value of Z=3000 we can generate an analytical approximation of the non-overlap constraint function between C1 and C2 as $$\left|\frac{2(3.0 - 4.0)}{3.2}\right|^{3000} + \left|\frac{2(4.5 - 4.0)}{2.2}\right|^{3000} > 1 \quad (118)$$

which is identical to Equation (112) generated in Example 1.

Example 3

Figure 13:
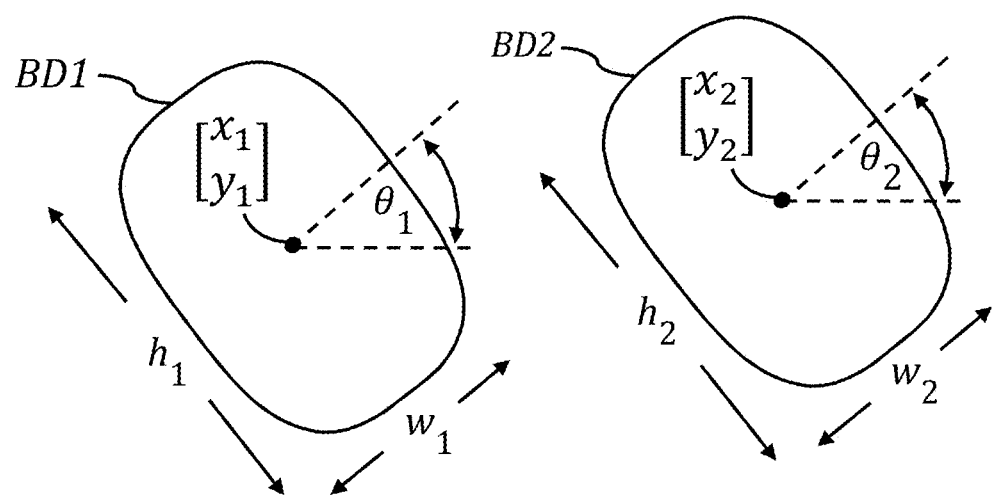
FIG. 13 illustrates two components to be cut from a sheet of material.

This example will illustrate the use of the method outlined in the flow chart of FIG. 11B. This example illustrates one application of this method in the manufacture of plate steel parts for one or two ships. In this example, as Illustrated in FIG. 13, we would like to check to see that the components for a pair of bulk head doors, BD1 and BD2, which are to be cut from a sheet of steel, are positioned such that they satisfy a non-overlap boundary distance constraint that accounts for the kerf of the cutting tool that will be used to cut the components from the sheet. The shape of BD1 and BD2 are cubic superellipses with height, width, and orientation $h_1$, $w_1$, $\theta_1$ and $h_2$, $w_2$, $\theta_2$ respectively. The width of the kerf of the cutting tool is d.

One skilled in the art can show that the shape spectrum for a two-dimensional superellipsoid having origin $[o_x, o_y]^T$, semidiameters $r_x$ and $r_y$, and exponent n, as defined by the equation $$\left|\frac{x - o_x}{r_x}\right|^n + \left|\frac{y - o_y}{r_y}\right|^n = 1,$$

has the following shape spectrum:

$$\mathcal{SE}(\theta) = \left(|r_x \sin(\theta)|^{\frac{n}{n-1}} + |r_y \cos(\theta)|^{\frac{n}{n-1}}\right)^{\frac{n-1}{n}} \quad (119)$$

From this we see that the parameterized shape spectrums for BD1 and BD2 are $$\mathcal{BD}1(\theta, \theta_1) = \left(\left|\frac{w_1}{2}\sin(\theta - \theta_1)\right|^{\frac{3}{2}} + \left|\frac{h_1}{2}\cos(\theta - \theta_1)\right|^{\frac{3}{2}}\right)^{\frac{2}{3}} \quad (120)$$

$$\mathcal{BD}2(\theta, \theta_2) = \left(\left|\frac{w_2}{2}\sin(\theta - \theta_2)\right|^{\frac{3}{2}} + \left|\frac{h_2}{2}\cos(\theta - \theta_2)\right|^{\frac{3}{2}}\right)^{\frac{2}{3}} \quad (121)$$

To account for the minimum distance, d, between BD1 and BD2 we define the following explicit distance spectrums for BD1 and BD2

$$\mathcal{D}_{\mathcal{BD}1}(\theta) = \mathcal{D}_{\mathcal{BD}2}(\theta) = \frac{d}{2} \quad (122)$$

To generate an analytical function representation of the non-overlap boundary distance constraint between BD1 and BD2 step 210 can use Equations (120), (121), and (122) to determine the parameterized shape spectrum for the EBSCA of shapes BD1 and BD2 with separation distance d as $$\mathcal{EB}(\theta, \theta_1, \theta_2, d) = \mathcal{BD}1(\theta, \theta_1) + \mathcal{D}_{\mathcal{BD}1}(\theta) + \mathcal{BD}2(\theta + 180°, \theta_2) + \quad (123)$$

$$\mathcal{D}_{\mathcal{BD}2}(\theta + 180°)$$

$$= \mathcal{BD}1(\theta, \theta_1) + \mathcal{BD}2(\theta, \theta_2) + d$$

$$= \left(\left|\frac{w_1}{2}\sin(\theta - \theta_1)\right|^{\frac{3}{2}} + \left|\frac{h_1}{2}\cos(\theta - \theta_1)\right|^{\frac{3}{2}}\right)^{\frac{2}{3}} +$$

-continued $$\left(\left|\frac{w_2}{2}\sin(\theta-\theta_2)^{\frac{3}{2}}\right|+\left|\frac{h_2}{2}\cos(\theta-\theta_2)\right|^{\frac{3}{3}}\right)^{\frac{2}{3}}+d$$

Based on Equations (65) through (68), one way to compute the value of a shape function, $$\mathbb{EB}\left(\begin{bmatrix}x_2\\y_2\\\theta_2\end{bmatrix},\begin{bmatrix}x_1\\y_1\\\theta_1\end{bmatrix}\right),$$

for the shape spectrum of Equation (123) is as follows:
Procedure 3:

1. Compute $\varphi = \tan^{-1}\left(\frac{y_2-y_1}{x_2-x_1}\right)$

2. Solve $\theta = \varphi - \tan^{-1}\left(\frac{\frac{\partial \mathcal{EB}(\theta,\theta_1,\theta_2,d)}{\partial \theta}}{\mathcal{EB}(\theta,\theta_1,\theta_2,d)}\right)$ for $\theta$ 3. Compute $x_p = \mathcal{EB}(\theta,\theta_1,\theta_2,d)\cos(\theta) - \sin(\theta)\frac{\partial \mathcal{EB}(\theta,\theta_1,\theta_2,d)}{\partial \theta} + x_1$ 4. Compute $y_p = \mathcal{EB}(\theta,\theta_1,\theta_2,d)\sin(\theta) + \cos(\theta)\frac{\partial \mathcal{EB}(\theta,\theta_1,\theta_2,d)}{\partial \theta} + y_1$ 5. Compute $\mathbb{EB}\left(\begin{bmatrix}x_2\\y_2\\\theta_2\end{bmatrix},\begin{bmatrix}x_1\\y_1\\\theta_1\end{bmatrix}\right) = \sqrt{\frac{(x_2-x_1)^2+(y_2-y_1)^2}{(x_p-x_1)^2+(y_p-y_1)^2}}$ From this we can define the analytical representation of the non-overlap constraint between BD1 and BD2 as $$\mathbb{EB}\left(\begin{bmatrix}x_2\\y_2\\\theta_2\end{bmatrix},\begin{bmatrix}x_1\\y_1\\\theta_1\end{bmatrix}\right) > 1 \quad (124)$$

Note that due to the form of the differential equation in step 2 of Procedure 3 it may be necessary to solve it using a numerical method such as, for example, a half interval search, where the initial interval is $0°\leq\theta<360°$.

Step 215 assigns values to $h_1$, $w_1$, $\theta_1$, $h_2$, $w_2$, $\theta_2$ and d.

Step 220 evaluates Equation (124) using the assignments of step 215 to determine if the non-overlap boundary distance constraint between BD1 and BD2 is satisfied.

While the present disclosure has been described in this disclosure regarding certain illustrated and described embodiments, those of ordinary skill in the art will recognize and appreciate that the present disclosure is not so limited. Rather, many additions, deletions, and modifications to the illustrated and described embodiments may be made without departing from the true scope of the invention, its spirit, or its essential characteristics as claimed along with their legal equivalents. In addition, features from one embodiment may be combined with features of another embodiment while still being encompassed within the scope of the invention as contemplated by the inventor. The described embodiments are to be considered only as illustrative and not restrictive. All changes which come within the meaning and range of equivalency of the claims are to be embraced within their scope. Disclosing the present invention is exemplary only, with the true scope of the present invention being determined by the included claims.

The invention claimed is:

1. A method to produce a verified design of an article of manufacture that comprises two or more components of the article and that uses a software program executing on a workstation that should satisfy an analytical representation of a boundary distance constraint between shapes of two components during verification of the design of the article of manufacture, comprising:
   providing a software program executing on a workstation, the workstation includes a processor, memory, and storage, the software program executes the following steps:
   providing a shape of a first component and providing a shape of a second component;
   providing a boundary distance constraint, the boundary distance constraint specifies a geometric relationship to be verified between the shape of the first component and the shape of the second component;
   constructing a shape spectrum of an exterior boundary surface of closest approach associated with the shape of the first component, the shape of the second component, and the boundary distance constraint, where the shape spectrum is an analytical representation of the boundary surface of closest approach and forms an analytical foundation for verifying the boundary distance constraint;
   verifying that an arrangement of the shape of the first component and the shape of the second component satisfies the boundary distance constraint;
   evaluating a subderivative of the shape spectrum of the exterior boundary surface of closest approach associated with the shape of the first component, the shape of the second component, and the boundary distance constraint, where the subderivative is used in verifying that the arrangement satisfies the boundary distance constraint and where the exterior boundary surface of closest approach is a shape that forms a geometric foundation for the step of verifying;
   wherein verifying that the boundary distance constraint is satisfied between the shape of the first component and the shape of the second component and when satisfied, the software program can produce a verified design of the article of manufacture.

2. The method of claim 1 where the boundary distance constraint is that the first component and second component do not overlap.

3. The method of claim 1 where the boundary distance constraint is that the first component and second component overlap by a fixed distance.

4. The method of claim 1 where the boundary distance constraint is that the first component and second component abut.

5. The method of claim 1 where the boundary distance constraint is that the first component and second component are no closer than a fixed distance.

6. A non-transitory program storage device readable by a computing device that tangibly embodies a program of instructions executable by the computing device to perform a method to produce a verified design of an article of manufacture that comprises two or more components of the article and that uses a software program executing on a workstation that should satisfy an analytical representation of a boundary distance constraint between shapes of two components during verification of the design of the article of manufacture, wherein the method comprises:

providing a software program executing on a workstation, the workstation includes a processor, memory, and storage, the software program executes the following steps:

providing a shape of a first component and providing a shape of a second component;

providing a boundary distance constraint, the boundary distance constraint specifies a geometric relationship to be verified between the shape of the first component and the shape of the second component;

constructing a shape spectrum of an exterior boundary surface of closest approach associated with the shape of the first component, the shape of the second component, and the boundary distance constraint, where the shape spectrum is an analytical representation of the boundary surface of closest approach and forms an analytical foundation for verifying the boundary distance constraint;

verifying that an arrangement of the shape of the first component and the shape of the second component satisfies the boundary distance constraint;

evaluating a subderivative of the shape spectrum of the exterior boundary surface of closest approach associated with the shape of the first component, the shape of the second component, and the boundary distance constraint, where the subderivative is used in verifying that the arrangement satisfies the boundary distance constraint and where the exterior boundary surface of closest approach is a shape that forms a geometric foundation for the step of verifying;

wherein verifying that the boundary distance constraint is satisfied between the shape of the first component and the shape of the second component and when satisfied, the software program can produce a verified design of the article of manufacture.

7. The non-transitory program storage device of claim 6 where the boundary distance constraint is that the first component and second component do not overlap.

8. The non-transitory program storage device of claim 6 where the boundary distance constraint is that the first component and second component overlap by a fixed distance.

9. The non-transitory program storage device of claim 6 where the boundary distance constraint is that the first component and second component abut.

10. The non-transitory program storage device of claim 6 where the boundary distance constraint is that the first component and second component are no closer than a fixed distance.

* * * * *

UNITED STATES PATENT AND TRADEMARK OFFICE
CERTIFICATE OF CORRECTION

PATENT NO. : 11,899,739 B2
APPLICATION NO. : 16/405488
DATED : February 13, 2024
INVENTOR(S) : Paul B. Morton It is certified that error appears in the above-identified patent and that said Letters Patent is hereby corrected as shown below:

In the Specification

Column 1, Cross Reference to Related Applications Line 10 Delete "incorporated" and insert --incorporates-- therefor Column 8, Disclosure of Embodiments Line 42 Delete "S2," and insert --S2;-- therefor Column 9, Disclosure of Embodiments Lines 31-34, Equation (4) Delete "$Boundary(C)=(Boundary(A) \cap Exterior(B)) \cup (Boundary(B) \cap Exterior(A))$" and insert --$Boundary(C) = \left(Boundary(A) \cap \overline{Exterior(B)}\right) \cup \left(Boundary(B) \cap \overline{Exterior(A)}\right)$-- therefor Column 10, Disclosure of Embodiments Line 23 Delete "$S(\theta)$," and insert --$S(\vec{\theta})$,-- therefor Column 10, Disclosure of Embodiments Line 24 Delete "$\theta_{1-1}]^T$" and insert --$\theta_{n-1}]^T$-- therefor Column 10, Disclosure of Embodiments Line 34 Delete "v" and insert --$v$-- therefor Column 10, Disclosure of Embodiments Line 38 Delete "$S(0)$," and insert --$S(\theta)$-- therefor Column 10, Disclosure of Embodiments Line 39 Delete "$S(0)$," and insert --$S(\theta)$-- therefor Column 10, Disclosure of Embodiments Line 39 Delete "E" and insert --∈-- therefor Column 10, Disclosure of Embodiments Lines 61-62, Equation (7) Delete "$\mathcal{T}^{-1}(\mathcal{T}(S))$," and insert --$\mathcal{T}^{-1}(\mathcal{T}(S))$,-- therefor Column 15, Disclosure of Embodiments Lines 21-23, Equation (19) Delete "$(\cup_{i=1,n}(A_i \odot B_j)))$" and insert --$((\cup_{i=1,n} A_i) \odot B_j))$-- therefor Signed and Sealed this
Twenty-sixth Day of March, 2024

*Katherine Kelly Vidal*

Katherine Kelly Vidal
*Director of the United States Patent and Trademark Office*

CERTIFICATE OF CORRECTION (continued)
U.S. Pat. No. 11,899,739 B2

Column 15, Disclosure of Embodiments Lines 30-33, Equation (21) Delete
"$\text{Interior}\left(\bigcup_{\substack{i=1,m \\ j=1,m}} (A_i \odot B_j)\right)$" and insert -- $\mathit{Interior}\left(\bigcup_{\substack{i=1,n \\ j=1,m}} (A_i \odot B_j)\right)$ -- therefor Column 17, Disclosure of Embodiments Line 62 Delete "Interior($\cup_{i=1,n}S_i$)," and insert --$\mathit{Interior}(\cap_{i=1,n}S_i)$,-- therefor Column 17, Disclosure of Embodiments Line 63 Delete "Exterior($\cup_{i=1,n}S_i$)," and insert --$\mathit{Exterior}(\cap_{i=1,n}S_i)$,-- therefor Column 17, Disclosure of Embodiments Line 63 Delete "Boundary($\cup_{i=1,n}S_i$)" and insert --$\mathit{Boundary}(\cap_{i=1,n}S_i)$-- therefor Column 18, Disclosure of Embodiments Line 20 Delete "$(\vec{X})$," and insert -- $\left(\mathbb{S}(\vec{X},\vec{O})\right)$, -- therefor Column 19, Disclosure of Embodiments Line 41 Delete "$P_{\vec{\theta}}(\vec{X},\vec{O})>1$" and insert -- $P_{\vec{\theta}}(\vec{X},\vec{O})>1$ -- therefor Column 19, Disclosure of Embodiments Line 45 Delete "$\overline{K}_{\vec{\theta}}$" and insert -- $K_{\vec{\theta}}$ -- therefor Column 19, Disclosure of Embodiments Lines 49-51, Equation (43) Delete
"$\overline{K}_{\vec{\theta}}{}^T\vec{X} + K_{\vec{\theta}>1} \forall \vec{X} \in \mathit{Exterior}$" and insert -- $\vec{K}_{\vec{\theta}}{}^T\vec{X} + K_{\vec{\theta}} > 1 \forall \vec{X} \in \mathit{Exterior}$ -- therefor Column 19, Disclosure of Embodiments Lines 63-65, Equation (45) Delete "$K_\theta$" and insert -- $K_{\vec{\theta}}$ -- therefor Column 20, Disclosure of Embodiments Lines 18-20, Equation (46) Delete "$P_{\vec{\theta}}(\vec{X},\vec{O})\}$" and insert -- $P_{\vec{\theta}}(\vec{X},\vec{O})\}$ -- therefor Column 20, Disclosure of Embodiments Line 59 Delete "PHS1∪PHS2." and insert -- $PHS1 \cap PHS2$. -- therefor Column 20, Disclosure of Embodiments Line 61 Delete "$\overline{K}_{\vec{\theta}}$" and insert -- $\vec{K}_{\vec{\theta}}$, -- therefor Column 21, Disclosure of Embodiments Lines 2-4, Equation (52) Delete
"$\overline{K}_{\vec{\theta}}{}^T\vec{X} + K_{\vec{\theta}} < 1$" and insert -- $\vec{K}_{\vec{\theta}}{}^T\vec{X} + K_{\vec{\theta}} < 1$ -- therefor Column 21, Disclosure of Embodiments Line 66 Delete "p=r-2 q" and insert --p=r-2q-- therefor

CERTIFICATE OF CORRECTION (continued)
U.S. Pat. No. 11,899,739 B2

Column 24, Disclosure of Embodiments Line 29 Delete "$\vec{0}\ 0)=1,$" and insert --$\vec{0})=1,$-- therefor Column 24, Disclosure of Embodiments Line 53 Delete "≠=" and insert --≠ Ø-- therefor Column 25, Disclosure of Embodiments Line 14 Delete "a," and insert --$\vec{\alpha},$-- therefor Column 25, Disclosure of Embodiments Line 14 Before "is undefined", delete "D(a)"

Column 25, Disclosure of Embodiments Line 20 Delete "$S_\Lambda(\vec{\alpha})$" and insert --$S_A(\vec{\alpha})$-- therefor Column 33, Disclosure of Embodiments Lines 53-55, Equation (117) Delete "$+\left|2\dfrac{4.5-\left(4.0+\dfrac{0.1-0.1}{2}\right)}{2+0.1+0.1+1}\right|^Z\right)$" and insert --$+\left|2\dfrac{4.5-\left(4.0+\dfrac{0.1-0.1}{2}\right)}{1+0.1+0.1+1}\right|^Z\right)$-- therefor Column 35, Disclosure of Embodiments Lines 2-4, Equation (123) Delete "$\left(\left|\dfrac{w_2}{2}\sin(\theta-\theta_2)^{\frac{3}{2}}\right|\right.$" and insert --$\left(\left|\dfrac{w_2}{2}\sin(\theta-\theta_2)\right|^{\frac{3}{2}}\right.$-- therefor